(12) United States Patent
Tsai et al.

(10) Patent No.: US 12,002,715 B2
(45) Date of Patent: Jun. 4, 2024

(54) SEMICONDUCTOR DEVICE AND METHOD

(71) Applicant: Taiwan Semiconductor Manufacturing Co., Ltd., Hsinchu (TW)

(72) Inventors: Ya-Yi Tsai, Hsinchu (TW); Wei-Ting Guo, Hsinchu (TW); I-Wei Yang, Yilan County (TW); Shu-Yuan Ku, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 196 days.

(21) Appl. No.: 16/923,348

(22) Filed: Jul. 8, 2020

(65) Prior Publication Data

US 2021/0125875 A1    Apr. 29, 2021

Related U.S. Application Data

(60) Provisional application No. 62/927,324, filed on Oct. 29, 2019.

(51) Int. Cl.
*H01L 21/8238* (2006.01)
*H01L 21/8234* (2006.01)
*H01L 27/088* (2006.01)

(52) U.S. Cl.
CPC ......... *H01L 21/823481* (2013.01); *H01L 21/823437* (2013.01); *H01L 27/0886* (2013.01); *H01L 21/823431* (2013.01)

(58) Field of Classification Search
None
See application file for complete search history.

(56) References Cited

U.S. PATENT DOCUMENTS

| 10,832,916 | B1 * | 11/2020 | Xie | H01L 27/1116 |
| 2010/0048026 | A1 | 2/2010 | Sone et al. | |
| 2015/0021710 | A1 | 1/2015 | Hsu et al. | |
| 2016/0225764 | A1 * | 8/2016 | Chang | H01L 29/495 |
| 2016/0247728 | A1 * | 8/2016 | You | H01L 21/823807 |
| 2016/0351568 | A1 | 12/2016 | Chang et al. | |
| 2017/0125411 | A1 | 5/2017 | Yu et al. | |
| 2017/0222020 | A1 * | 8/2017 | Yu | H01L 27/0886 |

(Continued)

FOREIGN PATENT DOCUMENTS

| KR | 20100024356 A | 3/2010 |
| KR | 20150010547 A | 1/2015 |

(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes forming a first fin and a second fin on a substrate; forming a dummy gate material over the first fin and the second fin; etching the dummy gate material using a first etching process to form a recess between the first fin and the second fin, wherein a sacrificial material is formed on sidewalls of the recess during the first etching process; filling the recess with an insulation material; removing the dummy gate material and the sacrificial material using a second etching process; and forming a first replacement gate over the first fin and a second replacement gate over the second fin, wherein the first replacement gate is separated from the second replacement gate by the insulation material.

20 Claims, 43 Drawing Sheets

(56) References Cited

U.S. PATENT DOCUMENTS

| | | |
|---|---|---|
| 2017/0222055 A1 | 8/2017 | Chang et al. |
| 2017/0316984 A1 | 11/2017 | Lin et al. |
| 2018/0144988 A1 | 5/2018 | Liou et al. |
| 2018/0366583 A1 | 12/2018 | Kim et al. |
| 2019/0067120 A1 | 2/2019 | Ching et al. |
| 2019/0067277 A1 | 2/2019 | Tsai et al. |
| 2019/0103325 A1 | 4/2019 | Huang et al. |
| 2019/0148539 A1 | 5/2019 | Yang et al. |
| 2019/0164844 A1 | 5/2019 | Huang et al. |
| 2019/0165155 A1 | 5/2019 | Chang et al. |
| 2019/0393324 A1 | 12/2019 | Chen et al. |
| 2020/0083222 A1* | 3/2020 | Kim ................ H01L 21/823821 |
| 2020/0357896 A1* | 11/2020 | Cheng ................ H01L 27/0886 |

FOREIGN PATENT DOCUMENTS

| | | |
|---|---|---|
| KR | 20190024534 A | 3/2019 |
| KR | 20190038393 A | 4/2019 |
| KR | 20190055774 A | 5/2019 |
| KR | 20190062131 A | 6/2019 |
| TW | 201806007 A | 2/2018 |

\* cited by examiner

SEMICONDUCTOR DEVICE AND METHOD

PRIORITY CLAIM AND CROSS-REFERENCE

This application claims the benefit of U.S. Provisional Application No. 62/927,324, filed on Oct. 29, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
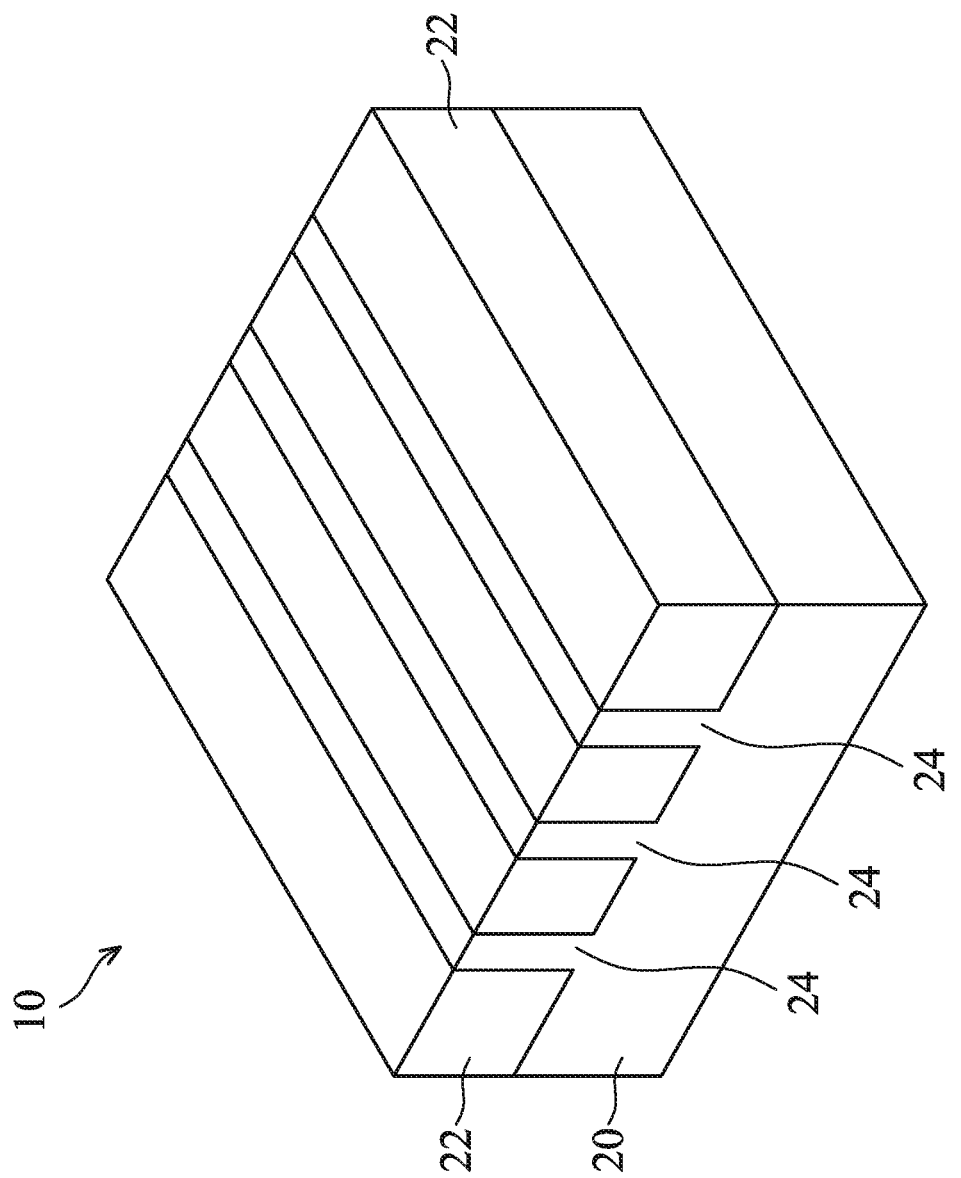
FIGS. 1-4, 5A, 5B, 6, 7A, 7B, 7C, 8A, 8B, 8C, 9, 10A, 10B, and 10C illustrate perspective views and cross-sectional views of intermediate stages in the formation of a Fin Field-Effect Transistors (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device and method of forming the same is provided in accordance with various embodiments. In particular, an isolation region is formed between neighboring gates of FinFET devices. The FinFET devices are formed in a gate-last process, where dummy gates are formed of polysilicon in an intermediate step of manufacturing. A recess is formed in the dummy gates between neighboring fins using an etching process, and a sacrificial material is formed on the sidewalls of the recess during the etching process. The etching process is controlled such that the sacrificial material causes the recesses to have a smaller top width than a bottom width. An isolation material is deposited into the recesses to form gate isolation regions having a smaller top width than a bottom width. By forming gate isolation regions having this tapered profile, material or residue may be more completely removed during subsequent process steps. Additionally, replacement gate material may be deposited near the gate isolation regions with greater filling efficiency and uniformity.

Throughout the various views and illustrative embodiments, like reference numbers are used to designate like elements. In some illustrated embodiments, the formation of Fin Field-Effect Transistors (FinFETs) is used as an example to explain the concept of the present disclosure. Other types of transistors such as planar transistors, Gate-All-Around (GAA) transistors, or the like may also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order. Some embodiments discussed herein are discussed in the context of FinFETs formed using a gate-last process. In other embodiments, a gate-first process may be used. Also, some embodiments contemplate aspects used in planar devices, such as planar FETs.

FIG. 1 illustrates a perspective view of an initial structure, in accordance with some embodiments. The initial structure includes a wafer 10, which further includes a substrate 20. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In FIG. 1, fins 24 are shown formed in the substrate 20. The fins 24 are semiconductor strips, and may be referred to as "semiconductor strips 24" or "strips 24." In accordance with some embodiments of the present disclosure, the fins 24 are parts of the original substrate 20, and hence the material of the fins 24 is the same as that of the substrate 20. In some embodiments, the fins 24 are formed by etching the portions of the substrate 20 to form recesses. The etching may be any acceptable etch process, such as a reactive ion etch (RIE), neutral beam etch (NBE), the like, or a combination thereof. The etch may be anisotropic. The fins 24 may be patterned by any suitable method. For example, the fins 24 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 24. In some embodiments, the mask (or other layer) may remain on the fins 24.

In some embodiments, the fins 24 may be formed by an epitaxial growth process. For example, a dielectric layer can be formed over a top surface of the substrate 20, and trenches can be etched through the dielectric layer to expose the underlying substrate 20. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 24. For example, the fins 24 in FIG. 1 can be recessed, and a material different from the fins 24 may be epitaxially grown over the recessed fins 24. In such embodiments, the fins 24 comprise the recessed material as well as the epitaxially grown material disposed over the recessed material. Accordingly, the fins 24 may be formed of a semiconductor material different from that of the substrate 20. In accordance with some embodiments, the fins 24 are formed of silicon; germanium; a compound semiconductor including silicon phosphide, silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In an even further embodiment, a dielectric layer can be formed over a top surface of the substrate 20, and trenches can be etched through the dielectric layer. Heteroepitaxial structures can then be epitaxially grown in the trenches using a material different from the substrate 20, and the dielectric layer can be recessed such that the heteroepitaxial structures protrude from the dielectric layer to form the fins 24. In some embodiments where homoepitaxial or heteroepitaxial structures are epitaxially grown, the epitaxially grown materials may be in situ doped during growth, which may obviate prior and subsequent implantations although in situ and implantation doping may be used together.

As shown in FIG. 1, Shallow Trench Isolation (STI) regions 22 may be formed between the fins 24. The STI regions 22 may comprise a material such as an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other materials formed by any acceptable process may be used. An anneal process may be performed once the material is formed. Although the STI regions 22 are illustrated as a single layer, some embodiments may utilize multiple layers. For example, in some embodiments a liner (not shown) may first be formed along surfaces of the substrate 20 and the fins 24. Thereafter, a fill material, such as those discussed above, may be formed over the liner.

After forming the material of the STI regions 22, a planarization process may be performed to remove material of the STI regions 22 and expose the fins 24. The planarization process may be, for example, a chemical mechanical polish (CMP), an etch-back process, combinations thereof, or the like. The planarization process may expose the fins 24 such that top surfaces of the fins 24 and the STI regions 22 are level after the planarization process is complete. In embodiments in which a mask remains on the fins 24, the planarization process may expose the mask or remove the mask such that top surfaces of the mask or the fins 24, respectively, and the STI regions 22 are level after the planarization process is complete.

Figure 2:
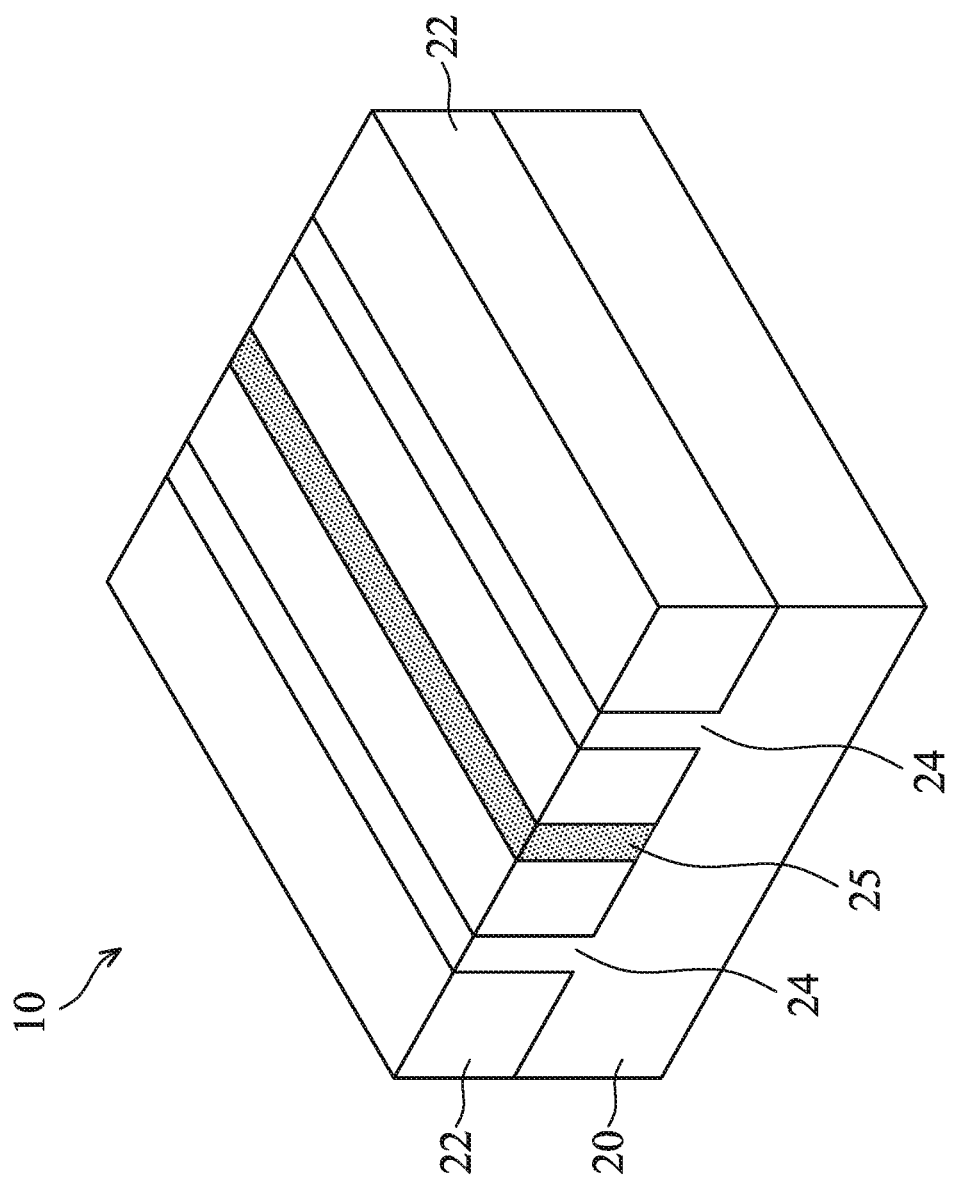

FIG. 2 illustrates the formation of a dielectric dummy fin 25 in accordance with some embodiments, which may be formed by etching one of the fins 24 to form a recess, and then filling the recess with a dielectric material. In other embodiments, the dielectric dummy fin 25 may be formed by etching a recess in the STI regions 22 and filling the recess with a dielectric material. In these embodiments, the bottom of the etched recess may be above a top surface of the substrate 20, level with a top surface of the substrate 20, or below a top surface of the substrate 20. The dielectric material may comprise a high-k dielectric material, a silicon oxide, a silicon nitride, the like, or combinations thereof. In some embodiments, the material of the dielectric dummy fin 25 is selected to have a low etching selectivity relative to the material of the STI regions 22. The bottom surface of the dielectric dummy fin 25 may be higher than, level with, or lower than, the bottom surfaces of the STI regions 22. The top surface of the dielectric dummy fin 25 may be level with surfaces of the fins 24 or of the STI regions 22.

Figure 3:
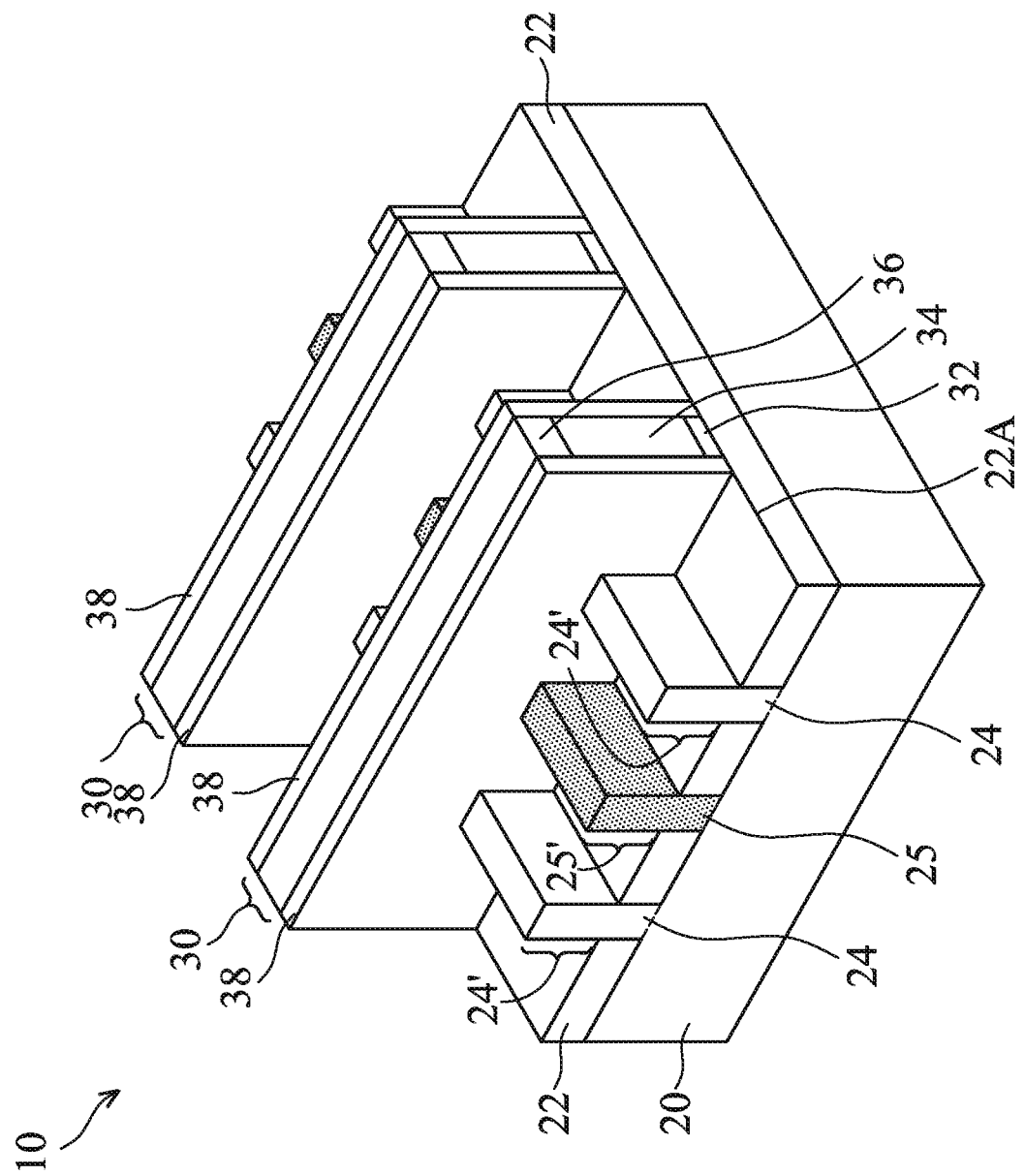

Referring to FIG. 3, the STI regions 22 are recessed. The STI regions 22 may be recessed such that top portions of the fins 24 and the dielectric dummy fin 25 protrude higher than the top surfaces 22A of the remaining portions of STI regions 22 to form protruding fins 24' and 25', respectively. The top surfaces of the STI regions 22 may have a flat surface as illustrated, a convex surface, a concave surface (such as dishing), or a combination thereof. The STI regions 22 may be recessed using an acceptable etching process, such as one that is selective to the material of the STI regions 22 (e.g., etches the material of the STI regions 22 at a faster rate than the material of the fins 24 or of the dielectric dummy fin 25). The etching may be performed, for example, using a dry etching process, such as a process in which wherein $HF_3$ and $NH_3$ are used as the etching gases. In accordance with alternative embodiments of the present disclosure, the recessing of the STI regions 22 is performed using a wet etch process. For example, an oxide removal using dilute hydrofluoric (dHF) acid may be used.

Further referring to FIG. 3, dummy gate stacks 30 are formed on the top surfaces and the sidewalls of the protruding fins 24' and 25'. Each dummy gate stack 30 may include a dummy gate dielectric 32 and dummy gate electrode 34 formed over the dummy gate dielectric 32. Each of dummy gate stacks 30 may also include a mask layer 36 over dummy gate electrode 34. The mask layer 36 may comprise one or more layers.

The dummy gate dielectric 32 may comprise, for example, silicon oxide, silicon nitride, a combination thereof, or the like, and may be deposited or thermally grown according to acceptable techniques. The dummy gate electrode 34 may be deposited over the dummy gate dielectric 32 and then planarized, such as by a CMP. The mask layer 36 may be deposited over the dummy gate electrodes 34. The dummy gate electrode 34 may be a conductive or non-conductive material and may be selected from a group including amorphous silicon, polycrystalline-silicon (poly-silicon), polycrystalline silicon-germanium (poly-SiGe), metallic nitrides, metallic silicides, metallic oxides, and metals. The dummy gate electrode 34 may be deposited by physical vapor deposition (PVD), CVD, sputter deposition, or other techniques known and used in the art for depositing the selected material. The dummy gate electrode 34 may be made of other materials that have a high etching selectivity from the etching of isolation regions. The mask layer 36 may include, for example, silicon nitride, silicon oxynitride, or the like. It is noted that the dummy gate dielectric 32 is shown covering the fins 24 and the STI regions 22, but in other embodiments, the dummy gate dielectric 32 may deposited such that the dummy gate dielectric 32 does not extend on surfaces of the STI regions 22.

The mask layer 36 may be formed of silicon nitride, silicon oxide, silicon carbo-nitride, or multi-layers thereof. Dummy gate stacks 30 may cross over a single one or a plurality of protruding fins 24' and 25' and/or STI regions 22. Dummy gate stacks 30 also have lengthwise directions perpendicular to the lengthwise directions of protruding fins 24'.

Next, gate spacers 38 are formed on the sidewalls of the dummy gate stacks 30. In some embodiments, a thermal oxidation or a deposition followed by an anisotropic etch may form the gate spacers 38. In accordance with some embodiments of the present disclosure, the gate spacers 38 are formed of a dielectric material such as silicon nitride, silicon oxide, silicon carbonitride, silicon oxynitride, silicon oxycarbonitride, or the like, and may be a single-layer structure or a multi-layer structure including multiple dielectric layers. After the formation of the gate spacers 38, implants for lightly doped source/drain (LDD) regions (not explicitly illustrated) may be performed. In some embodiments, one or more layers of the gate spacers 38 are formed after implantation of the LDD regions.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
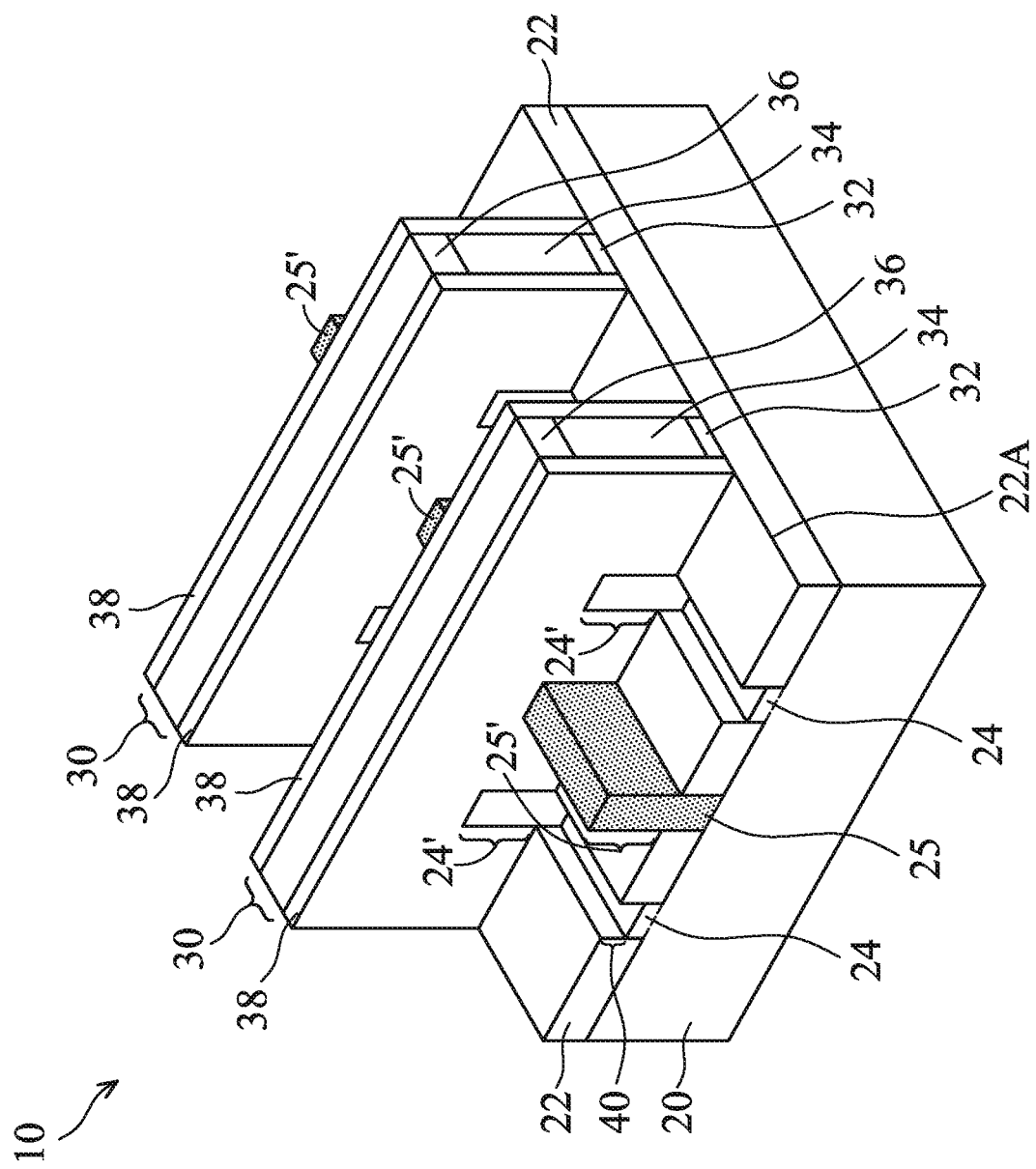

In FIG. 4, an etching step (referred to as source/drain recessing hereinafter) may be performed to etch the portions of the protruding fins 24' that are not covered by the dummy gate stack 30 and the gate spacers 38, in accordance with some embodiments of the present disclosure. The recessing may be anisotropic etching process that does not etch the portions of the protruding fins 24' directly underlying the dummy gate stacks 30 and the gate spacers 38. The top surfaces of the recessed fins 24 may be lower than the top surfaces 22A of the STI regions 22. The spaces left by the etched portions of the protruding fins 24' are referred to as recesses 40. In the etching process, the dielectric dummy fin 25' is not etched. For example, the protruding fins 24' may be etched using a selective etch such as $NF_3$ and $NH_3$, HF and $NH_3$, or the like.

Figure 5A:
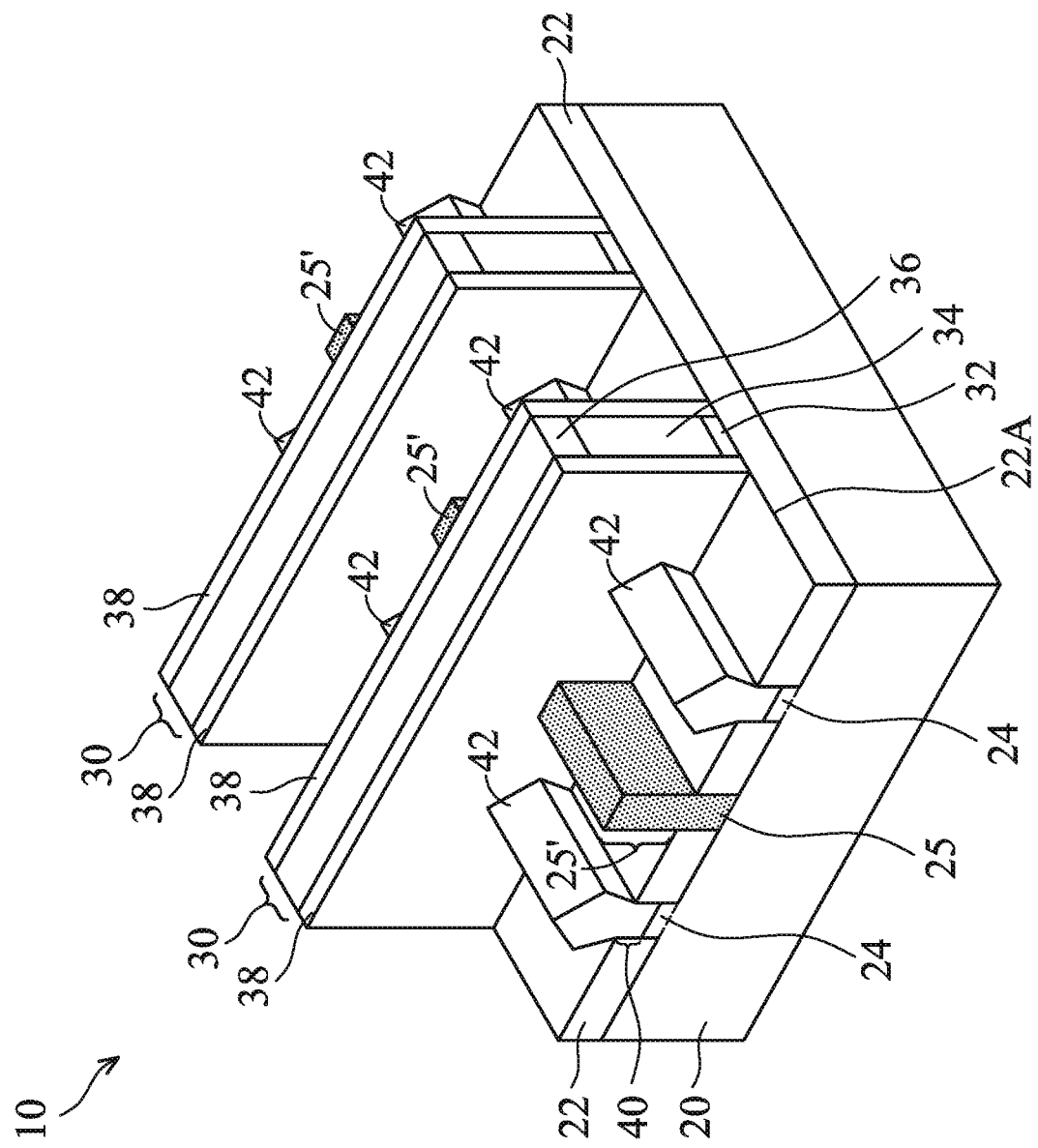
Figure 5B:
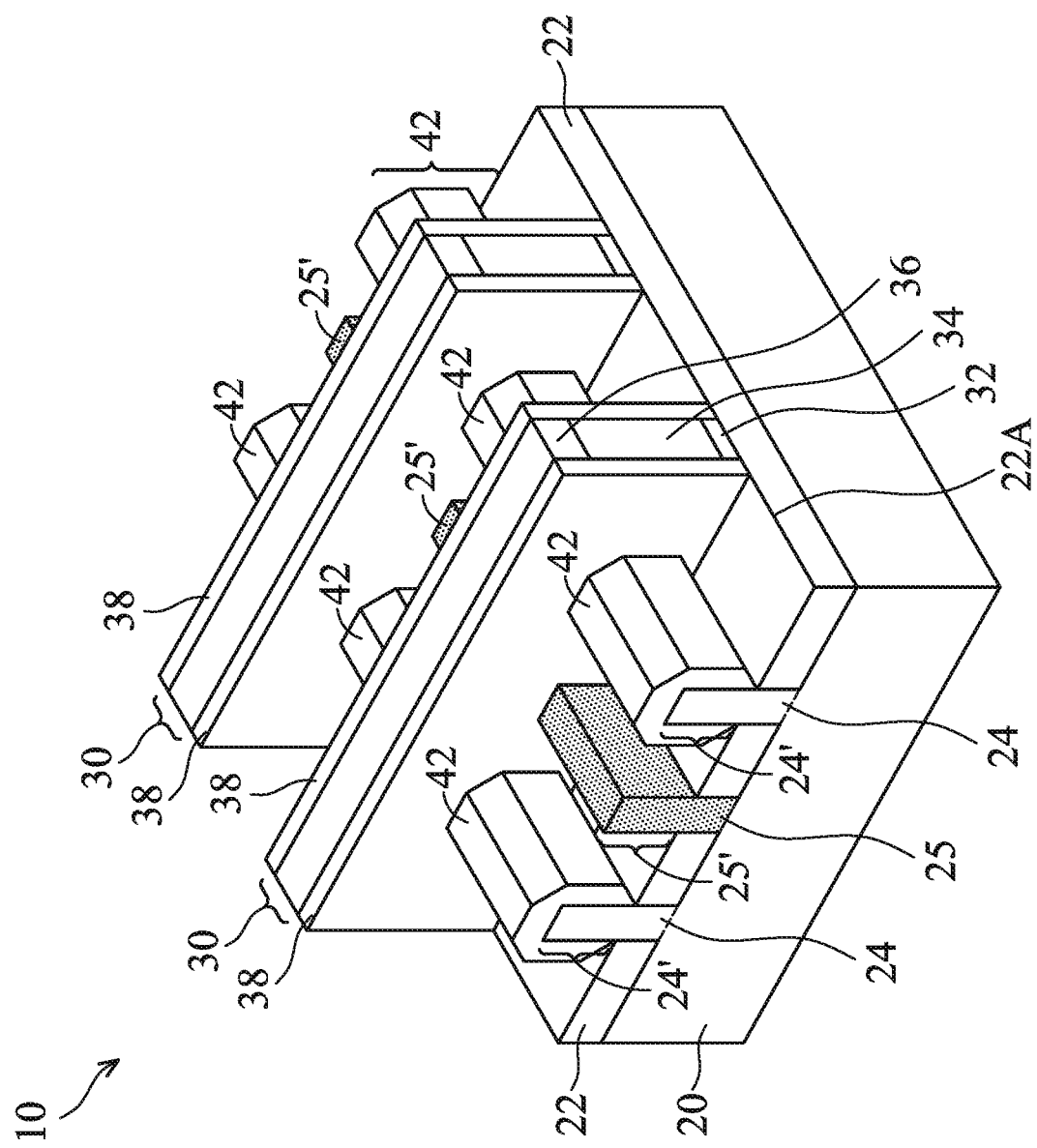

Turning to FIGS. 5A-B, epitaxial source/drain regions 42 are formed, in accordance with some embodiments. The epitaxial source/drain regions 42 may be formed, for example, by selectively growing semiconductor material(s) from the recesses 40, resulting in the structure shown in FIG. 5A. In accordance with some embodiments, the epitaxial source/drain regions 42 include silicon germanium, silicon, silicon carbon, germanium, the like, or combinations thereof. Depending on whether the resulting FinFET is a p-type FinFET or an n-type FinFET, a p-type or an n-type impurity may be in-situ doped during the epitaxial growth process. For example, when the resulting FinFET is a p-type FinFET, silicon germanium, germanium, germanium tin, boron-doped silicon germanium (SiGeB), boron-doped germanium, the like, or combinations thereof may be grown. When the resulting FinFET is an n-type FinFET, silicon phosphide (SiP), silicon carbide (SiC), phosphorous-doped silicon carbide (SiCP), or the like, may be grown. In accordance with alternative embodiments of the present disclosure, epitaxial source/drain regions 42 are formed of a III-V compound semiconductor such as GaAs, InP, GaN, InGaAs, InAlAs, GaSb, AlSb, AlAs, AlP, GaP, combinations thereof, or multi-layers thereof. The epitaxial source/drain regions 42 may also have surfaces raised from respective surfaces of the fins 24 and may have facets.

FIG. 5B illustrates the formation of epitaxial source/drain regions 42 in accordance with alternative embodiments of the present disclosure, in which the protruding fins 24' as shown in FIG. 4 are not recessed, and the epitaxial source/drain regions 42 are grown on the protruding fins 24'. The material of the epitaxial source/drain regions 42 of FIG. 5B may be similar to that of the epitaxial source/drain regions 42 as shown in FIG. 5A, depending on whether the resulting FinFET is a p-type or an n-type FinFET. In some cases, the epitaxial source/drain regions 42 may be considered to also include the protruding fins 24'. An implantation may (or may not) be performed to implant the epitaxial source/drain regions 42 with an n-type impurity or a p-type impurity. Subsequent Figures illustrate structures formed from the structure shown in FIG. 5B, but the embodiments and techniques described herein may be used with the structure shown in FIG. 5A or other structures, embodiments, or devices.

Figure 6:
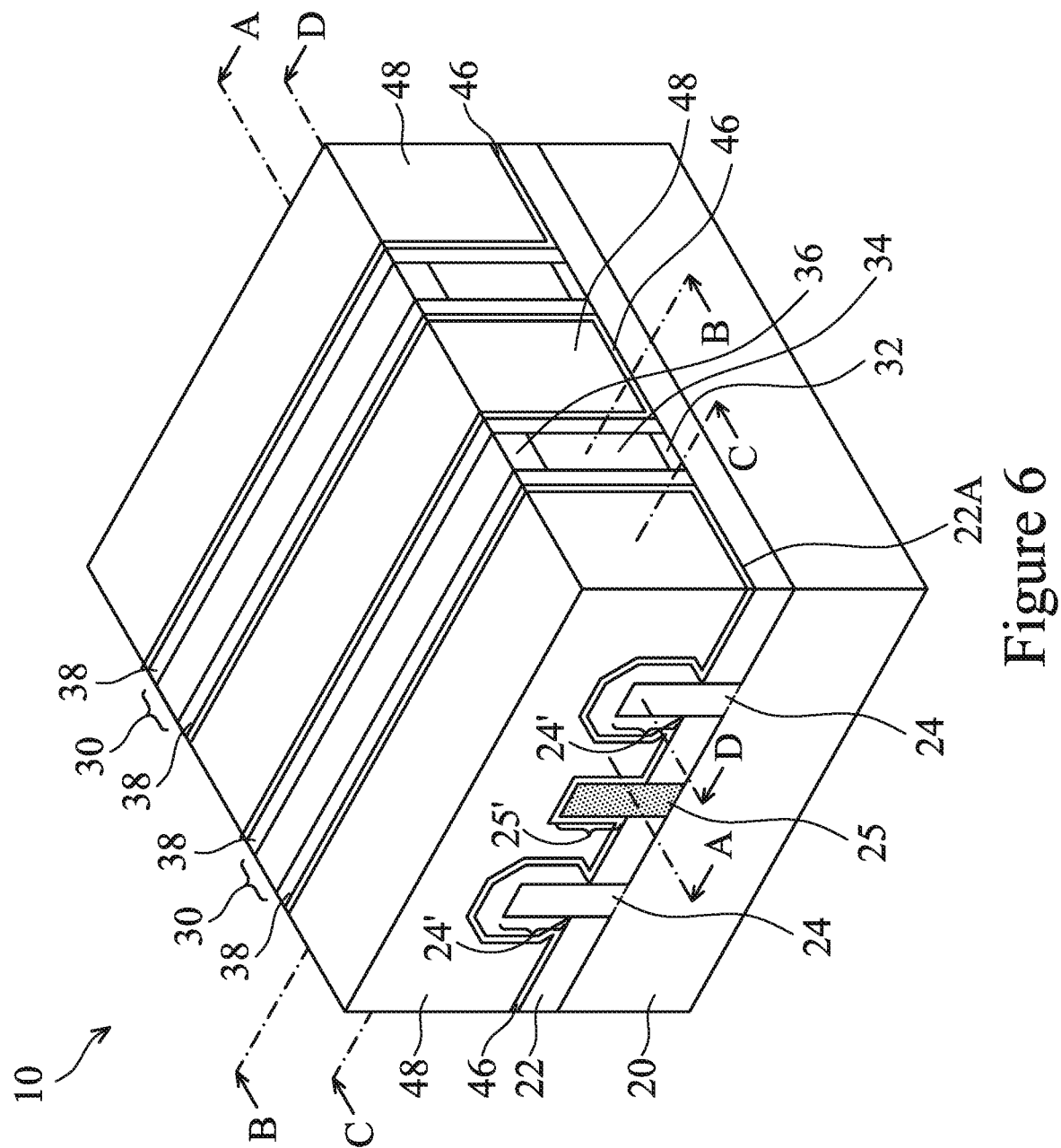

In FIG. 6, a first interlayer dielectric (ILD) 48 is deposited over the structure illustrated in FIG. 5B. The first ILD 48 may be formed of a dielectric material, and may be deposited by any suitable method, such as CVD, plasma-enhanced CVD (PECVD), or flowable CVD (FCVD). Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 46 is disposed between the first ILD 48 and the epitaxial source/drain regions 42, the mask layer 36, and the gate spacers 38. The CESL 46 may comprise a dielectric material, such as, silicon nitride, silicon oxide, silicon oxynitride, silicon carbonitride, or the like, having a different etch rate than the material of the overlying first ILD 48. A planarization process such as a CMP process or a mechanical grinding process may be performed to level the top surfaces of ILD 48, dummy gate stacks 30, and gate spacers 38 with each other, as shown in FIG. 6.

Figure 19A:
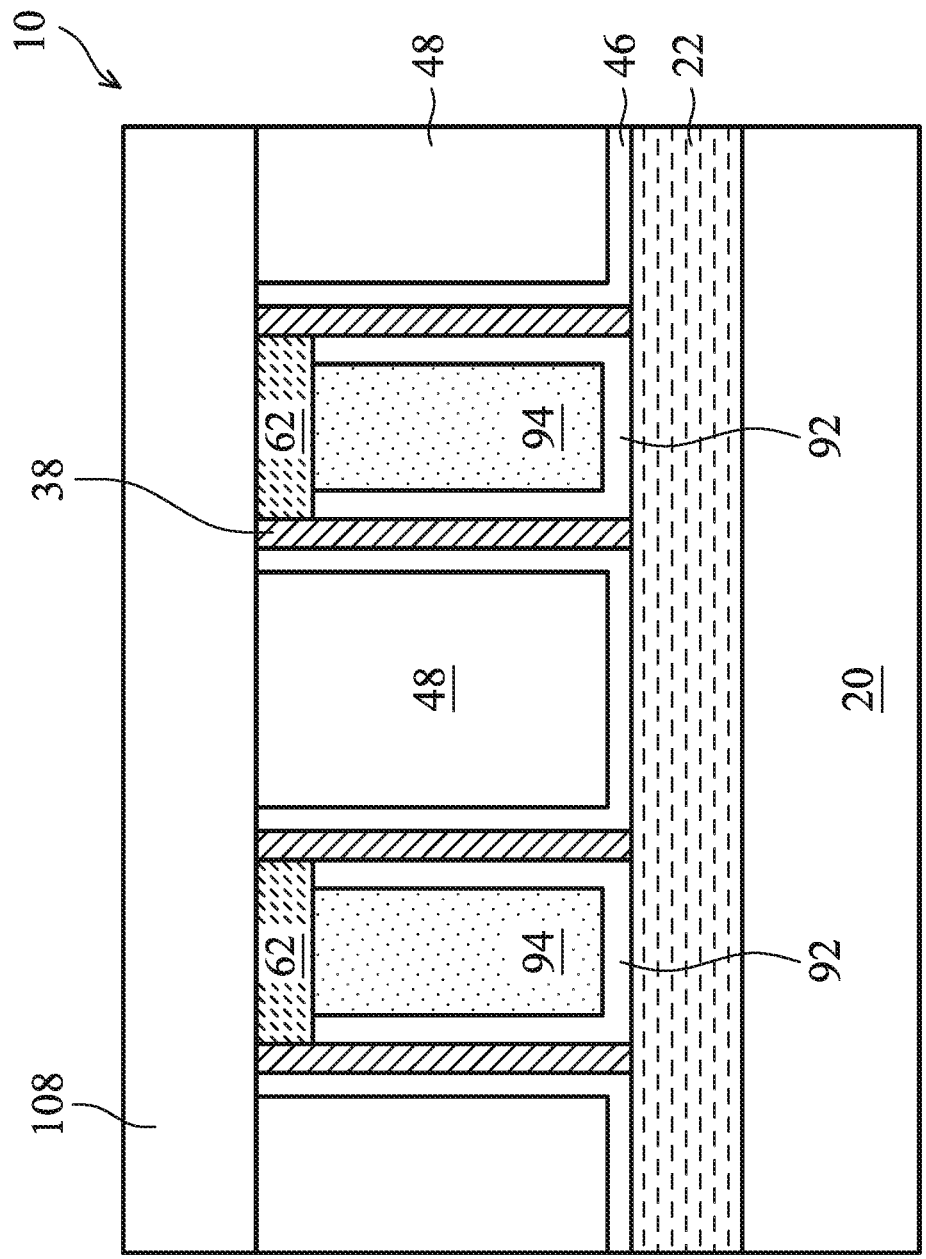
Figure 19B:
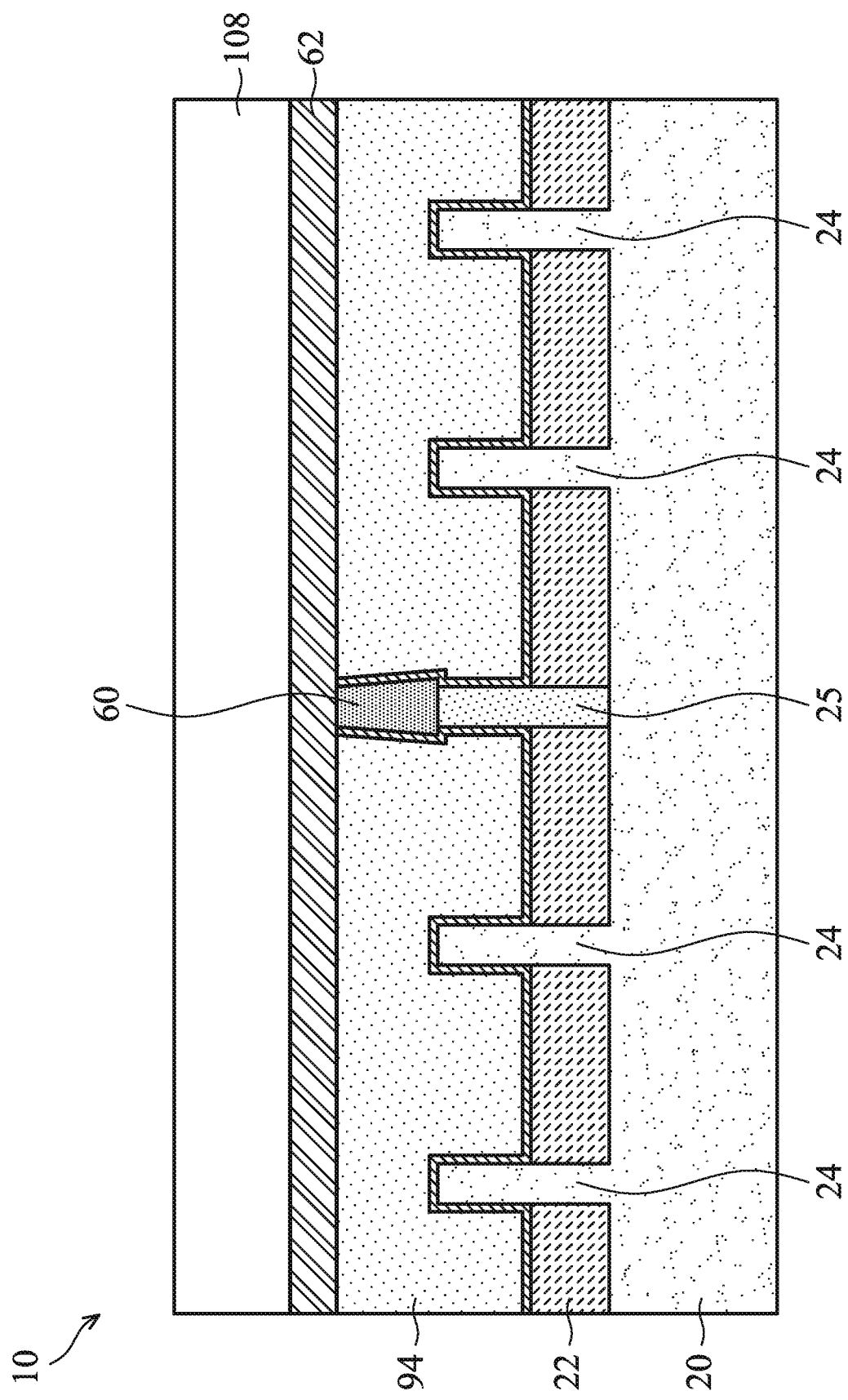
Figure 19C:
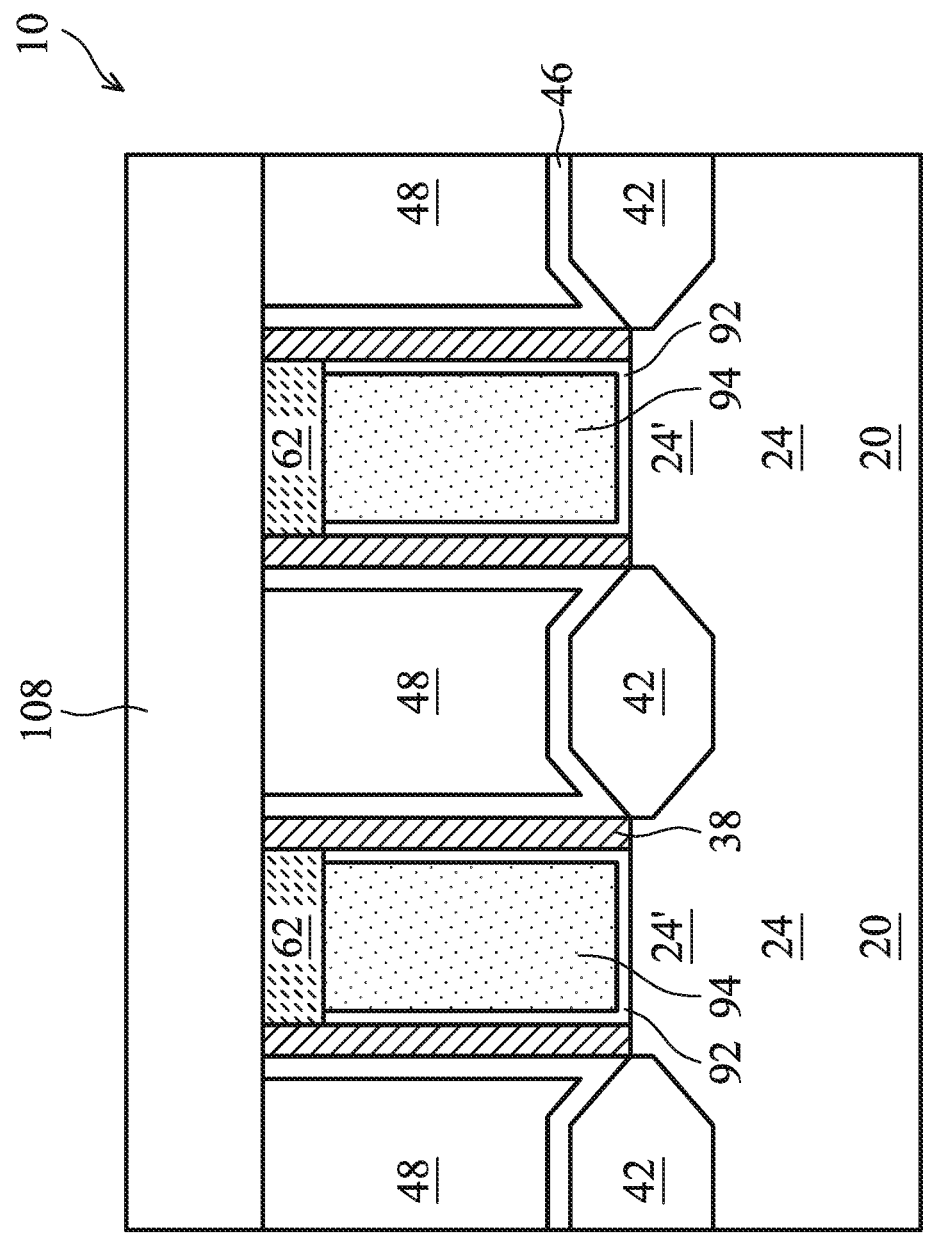
Figure 20A:
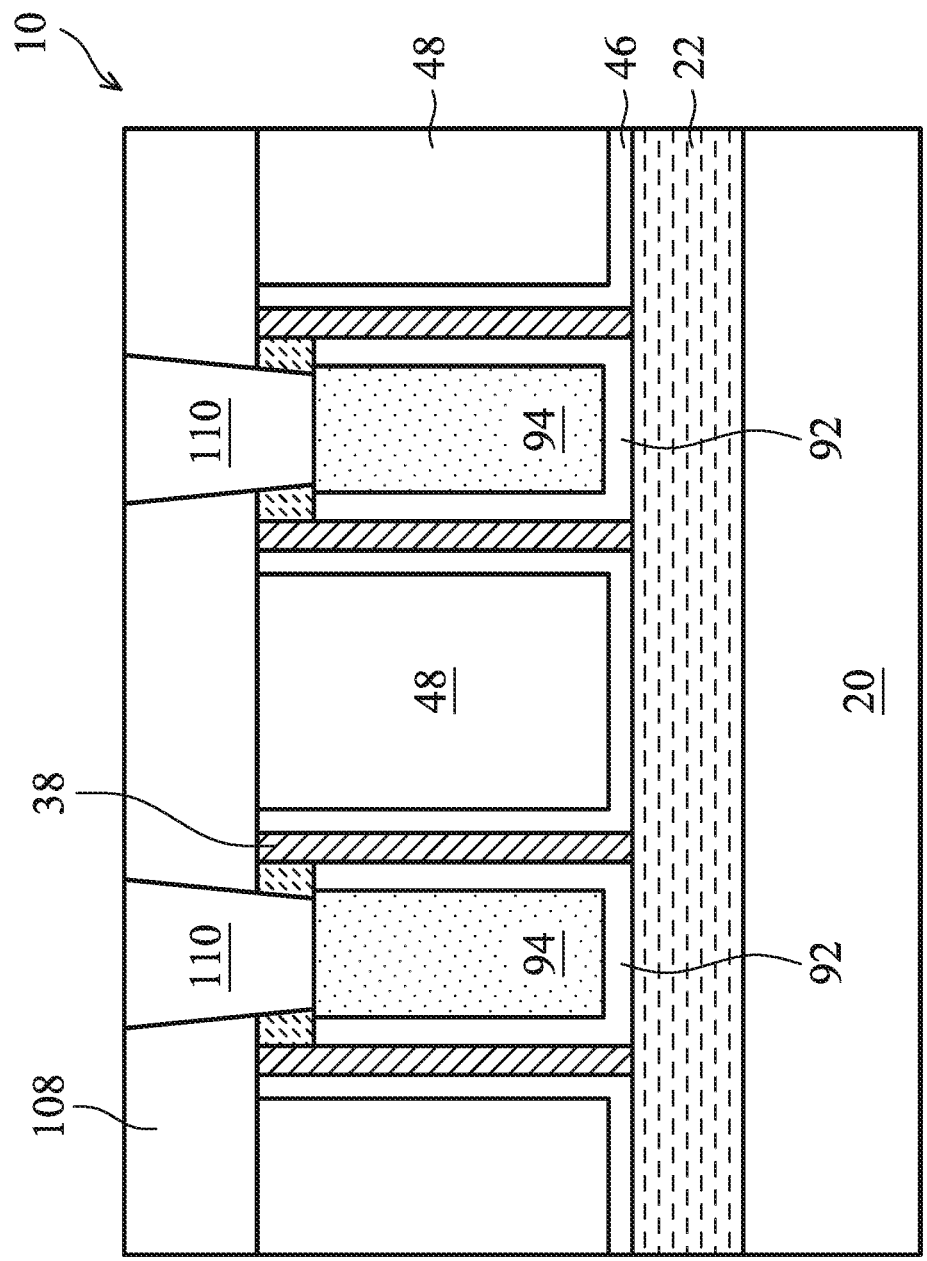
Figure 20B:
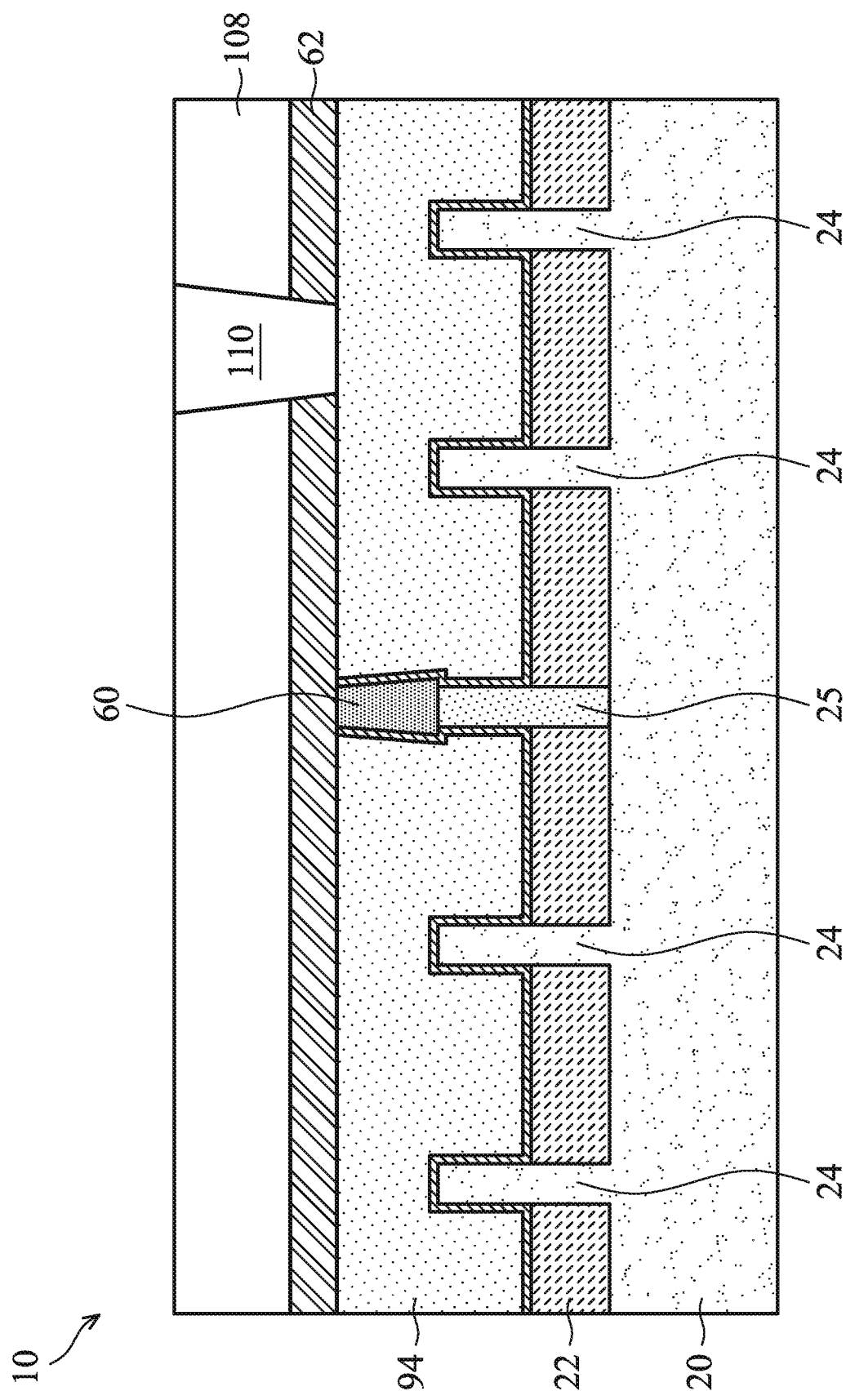
Figure 20C:
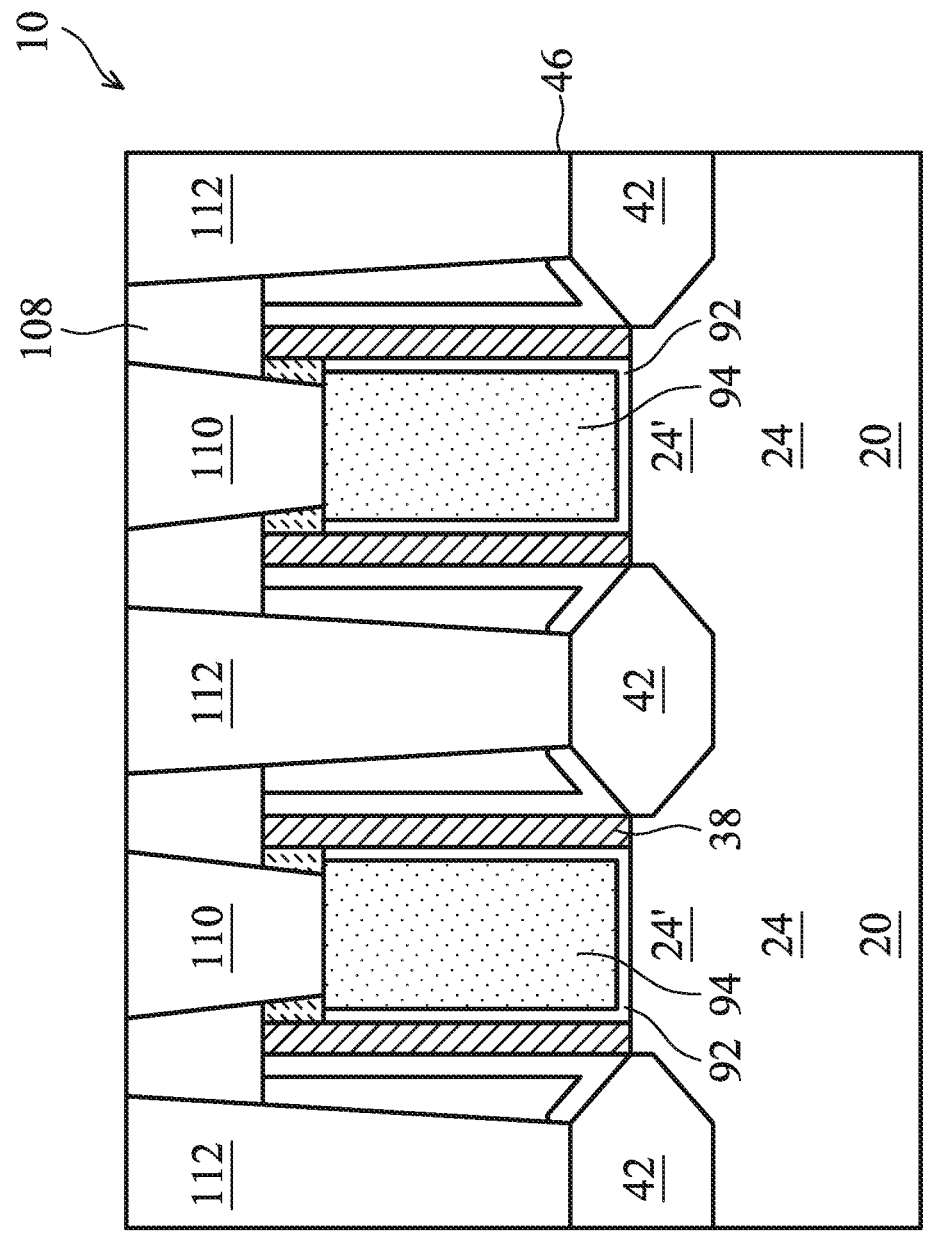

FIGS. 7A through 20C illustrate a gate isolation process (FIGS. 11A-16B) followed by a process for forming contacts (FIGS. 20A-20C). The figure numbers of the subsequent processes may include the letter "A," "B," or "C." Unless specified otherwise, the figures with numbers having the letter "A" are obtained from the vertical plane same as the vertical plane containing line A-A in FIG. 6, the figures with numbers having the letter "B" are obtained from the vertical plane same as the vertical plane containing line B-B in FIG. 6, and the figures with numbers having the letter "C" are obtained from the vertical plane same as the vertical plane containing line C-C in FIG. 6. FIGS. 18C, 19C, and 20C are obtained from the vertical plane same as the vertical plane containing line D-D in FIG. 6.

Figure 7A:
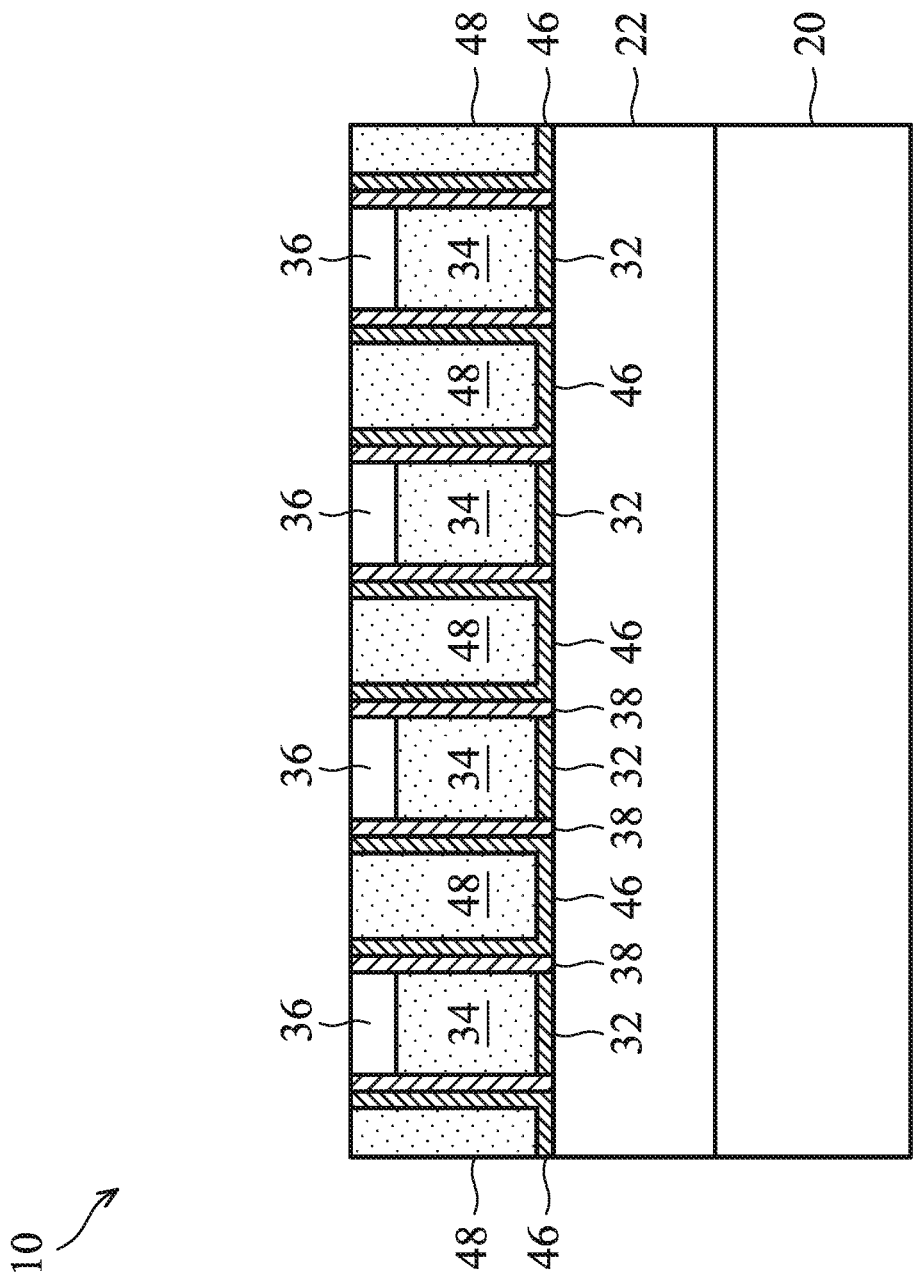
Figure 7B:
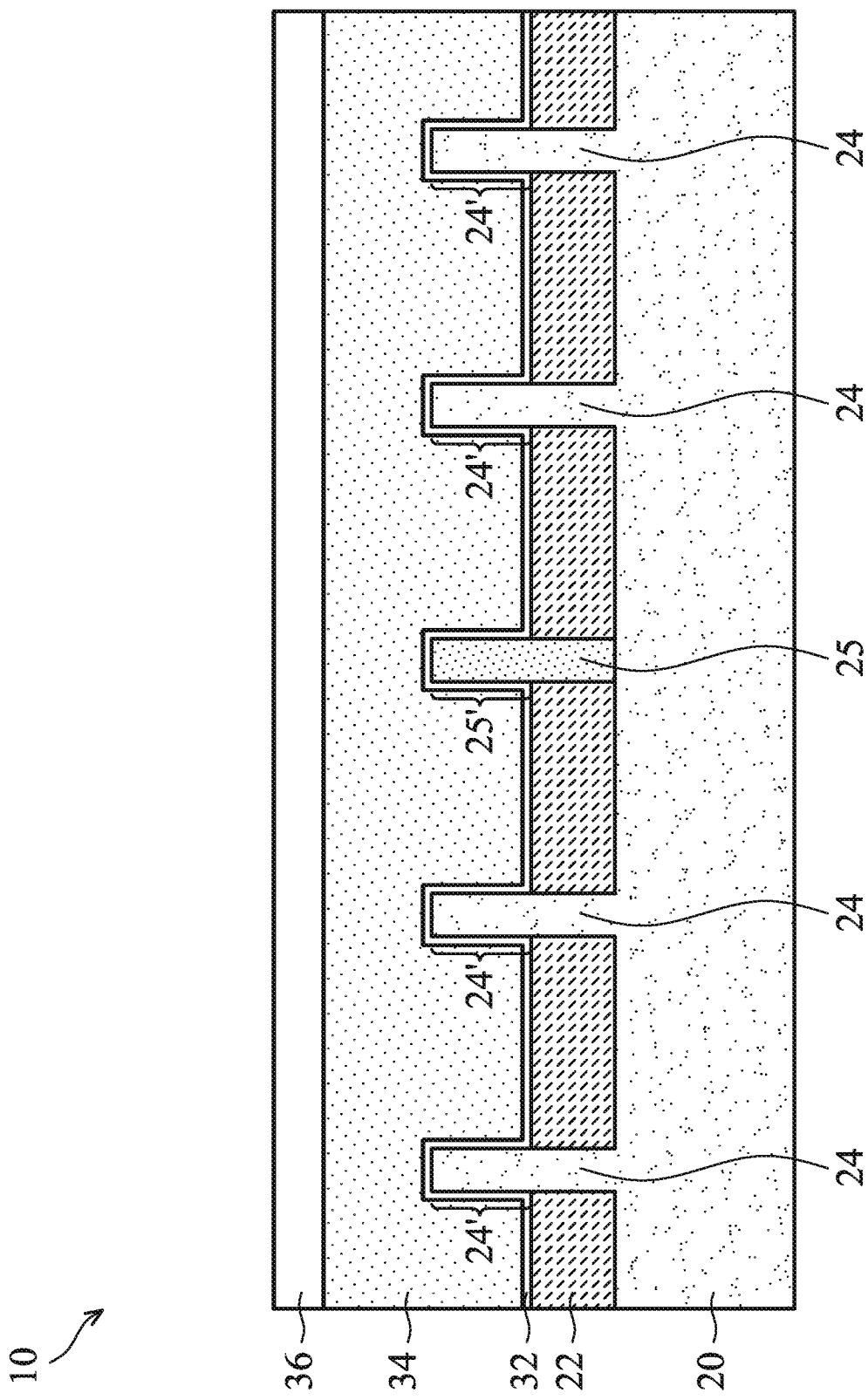
Figure 7C:
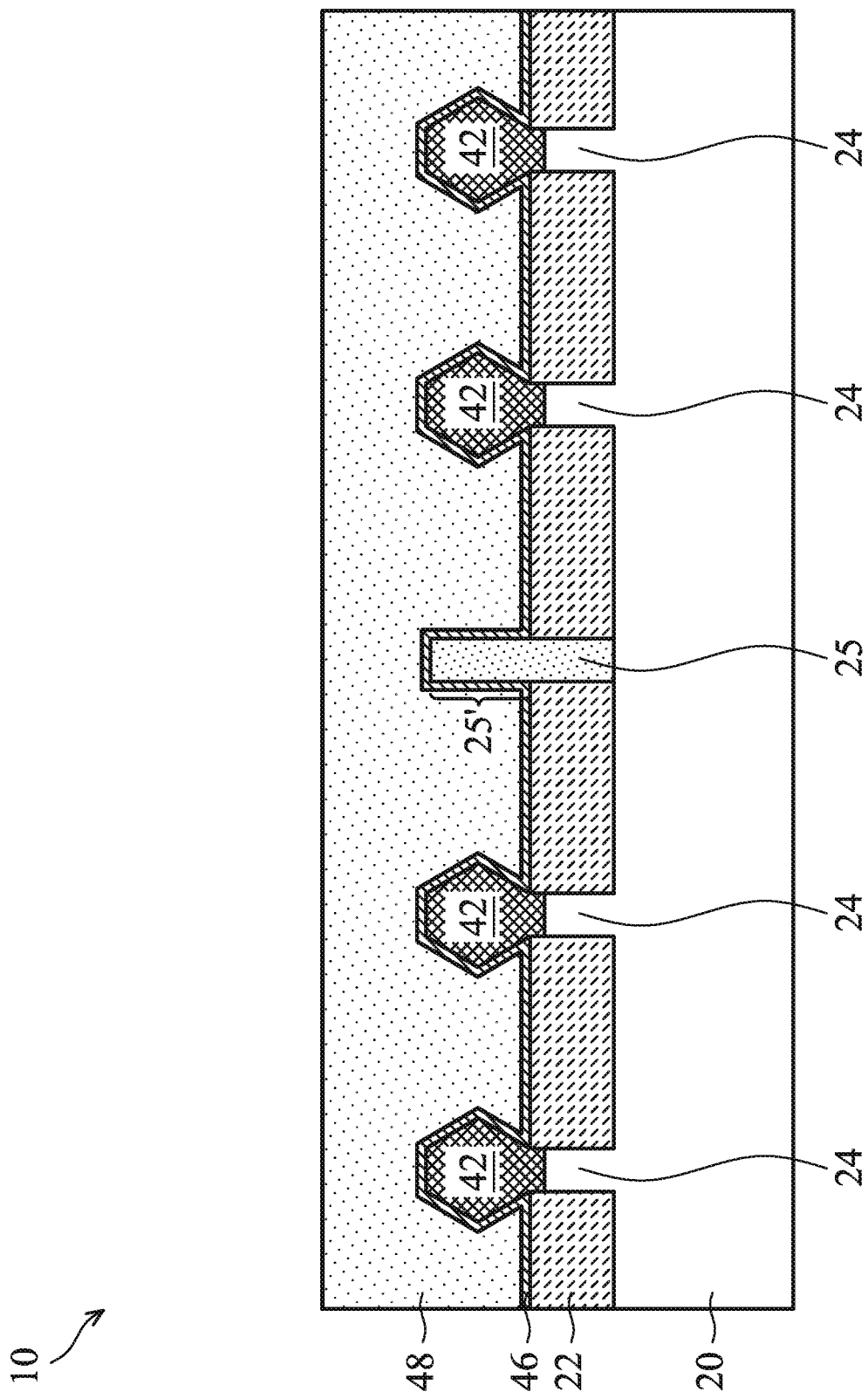

For example, FIGS. 7A, 7B, and 7C illustrate cross-sectional views of the structure shown in FIG. 6, in accordance with some embodiments. FIG. 7A is illustrated along cross-section A-A, FIG. 7B is illustrated along cross-section B-B, and FIG. 7C is illustrated along cross-section C-C.

Figure 8A:
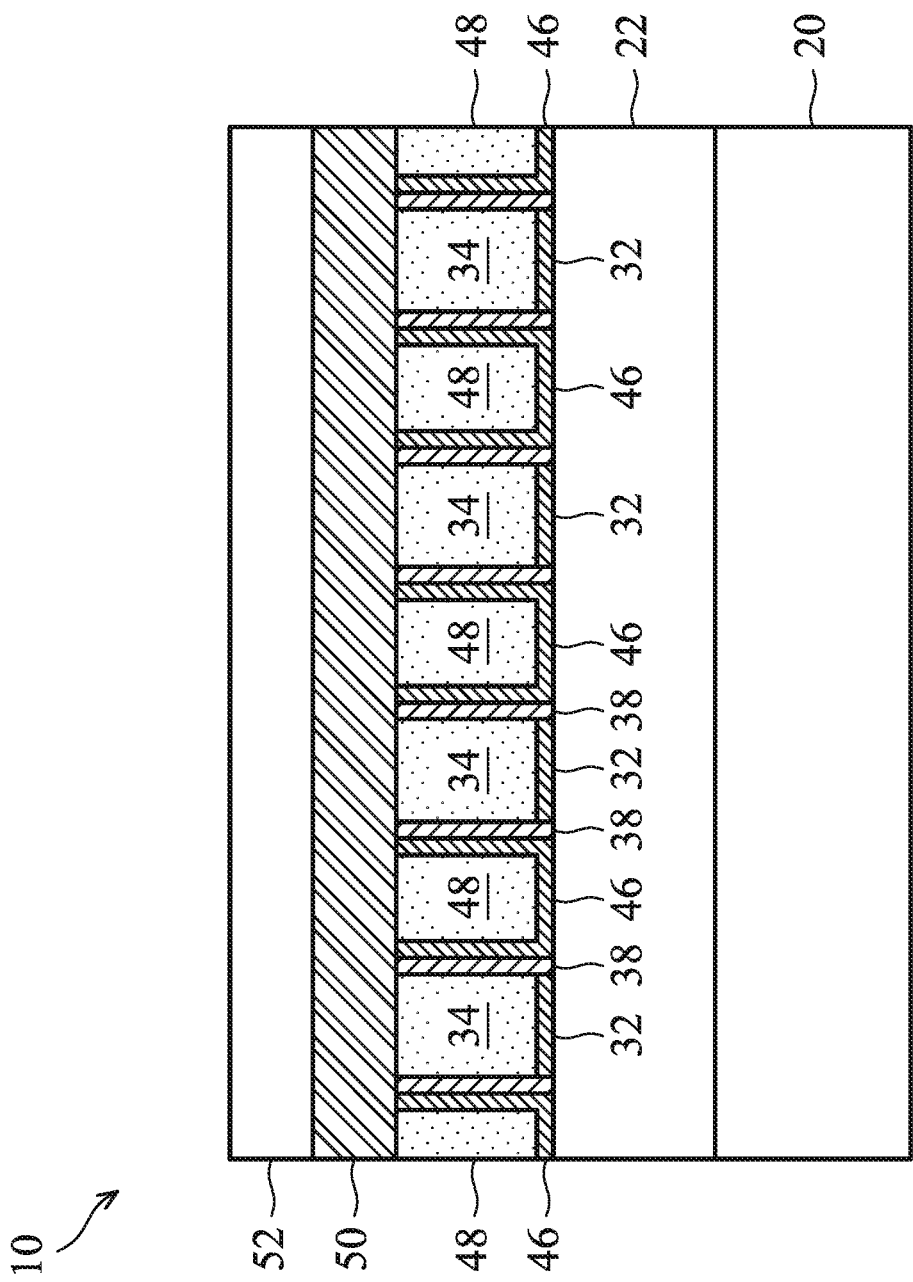
Figure 8B:
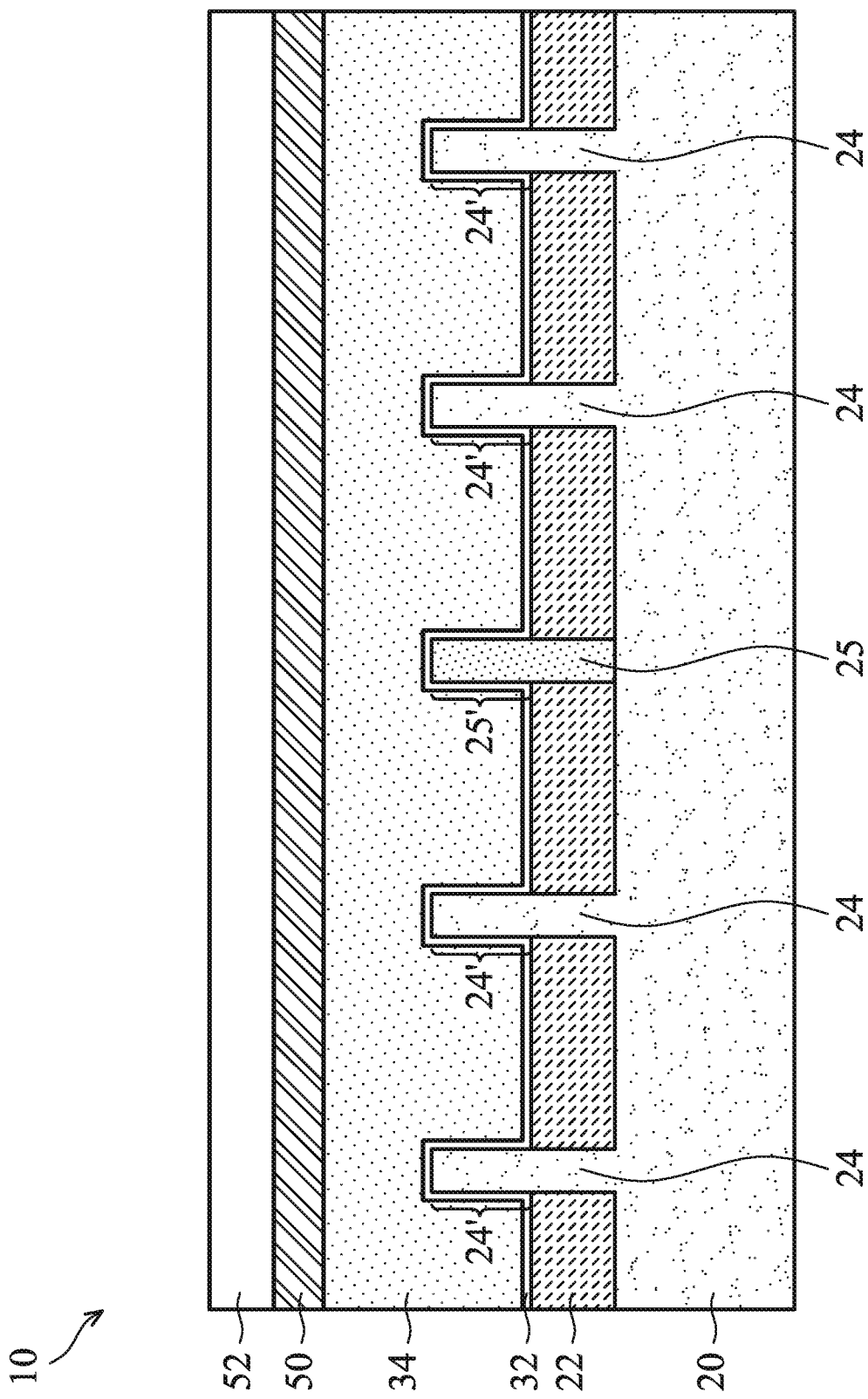
Figure 8C:
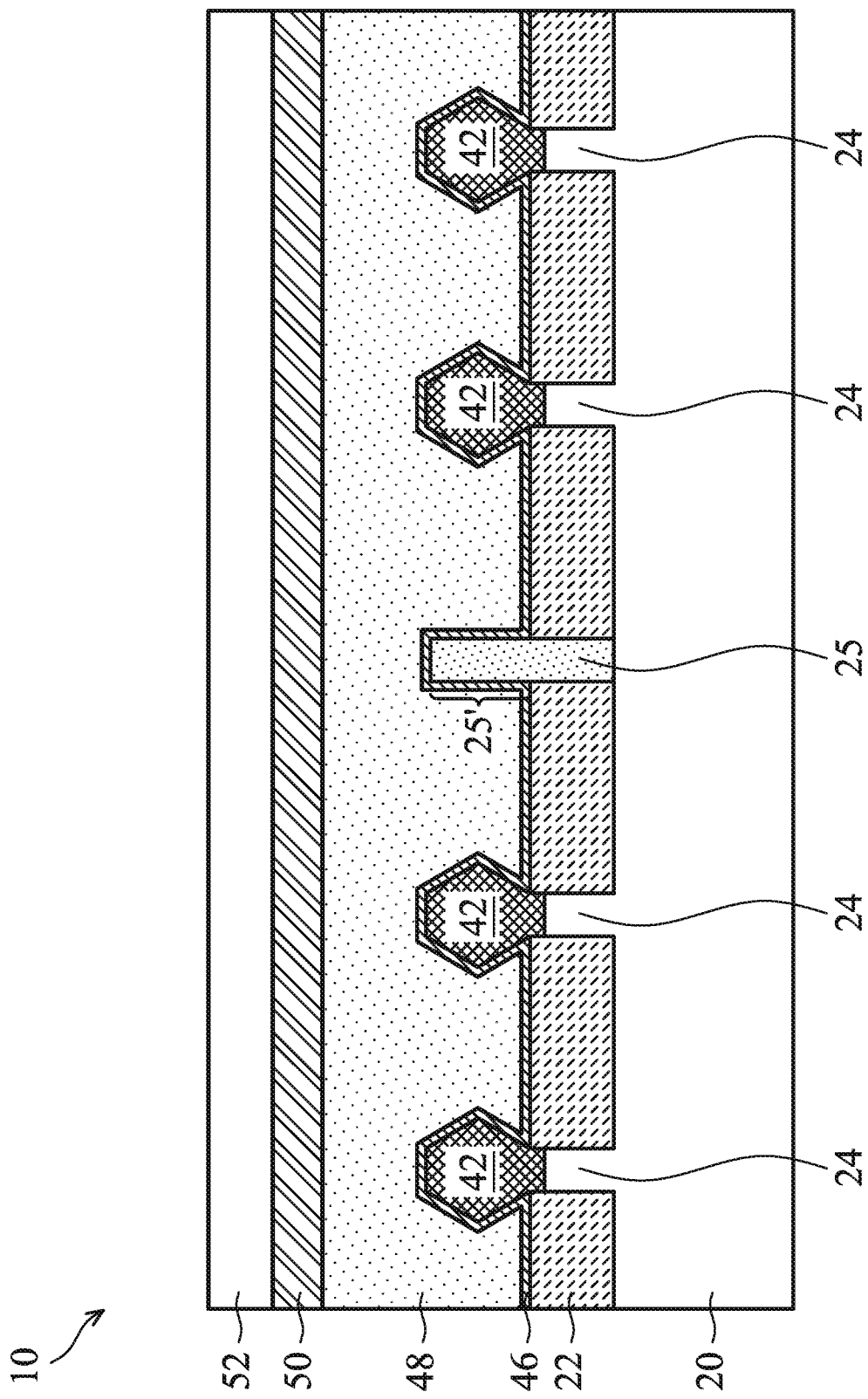

In FIGS. 8A, 8B, and 8C, a mask layer 50, such as a hard mask, is deposited over the structure illustrated in FIGS. 6, 7A, 7B, and 7C, and a photoresist structure 52 is formed over the mask layer 50, in accordance with some embodiments. The mask layer 50 may comprise silicon nitride, silicon oxynitride, silicon carbonitride, silicon oxycarbonitride, silicon oxide, the like, or a combination thereof. The mask layer 50 may be formed by CVD, PVD, ALD, a spin-on-dielectric process, the like, or a combination thereof. In some embodiments, the mask layer 50 is formed having a thickness that is between about 20 nm and about 120 nm. In some embodiments, the photoresist structure 52 is formed using a spin-on technique or the like, and may be formed having a thickness that is between about 5 nm and about 20 nm. These are examples, and other thicknesses or techniques are possible.

In some embodiments, the photoresist structure 52 is a tri-layer photoresist structure. In these embodiments, the tri-layer photoresist structure 52 includes a top photoresist layer, a middle layer, and a bottom layer (not individually labeled in FIGS. 8A, 8B, and 8C). As the limits of photolithography processes are reached by advanced semiconductor manufacturing processes, the need for thinner top photoresist layers has arisen to achieve smaller process windows. However, thin top photoresist layers may not be sufficiently robust to support the etching of target layers (e.g., the mask layer 50). The tri-layer photoresist structure 52 can provide a relatively thin top photoresist layer. The middle layer may include anti-reflective materials (e.g., a backside anti-reflective coating (BARC) layer) to aid the exposure and focus of the top photoresist layer's processing. By having the middle layer, the thin top photoresist layer is only used to pattern the middle layer. The bottom layer may include a hard mask material such as a carbon-containing material that is easily removed by $O_2$, a $N_2/H_2$ plasma, or the like. The middle layer is used to pattern the bottom layer. In some embodiments, the middle layer has a high etch selectivity to the bottom layer, and in some embodiments, the bottom layer is more than ten times thicker than the middle layer. Thus, the tri-layer photoresist structure 52 allows for the robust patterning of underlying layers (e.g., the mask layer 50) while still providing a relatively thin top photoresist layer.

Figure 9:
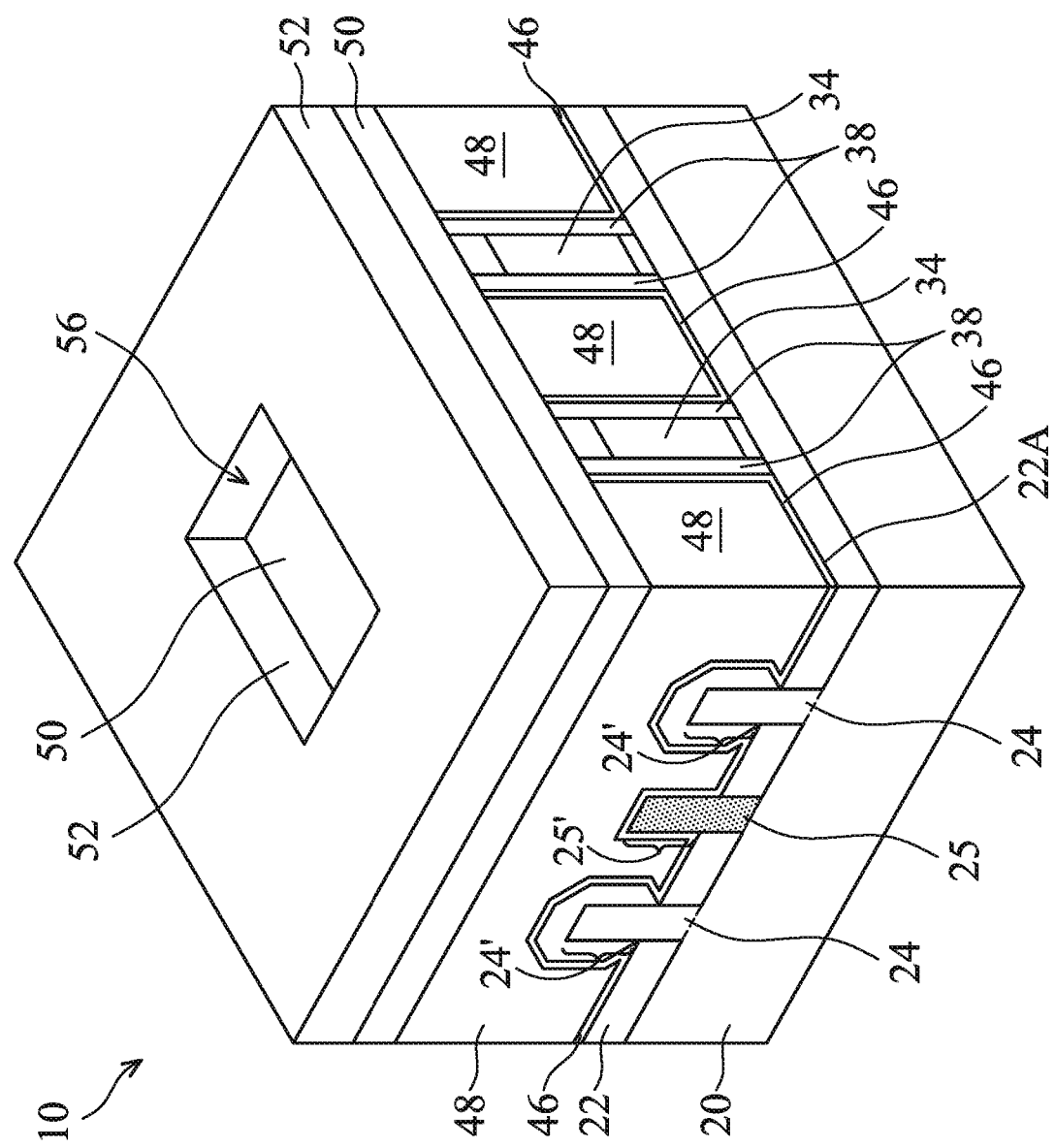
Figure 10A:
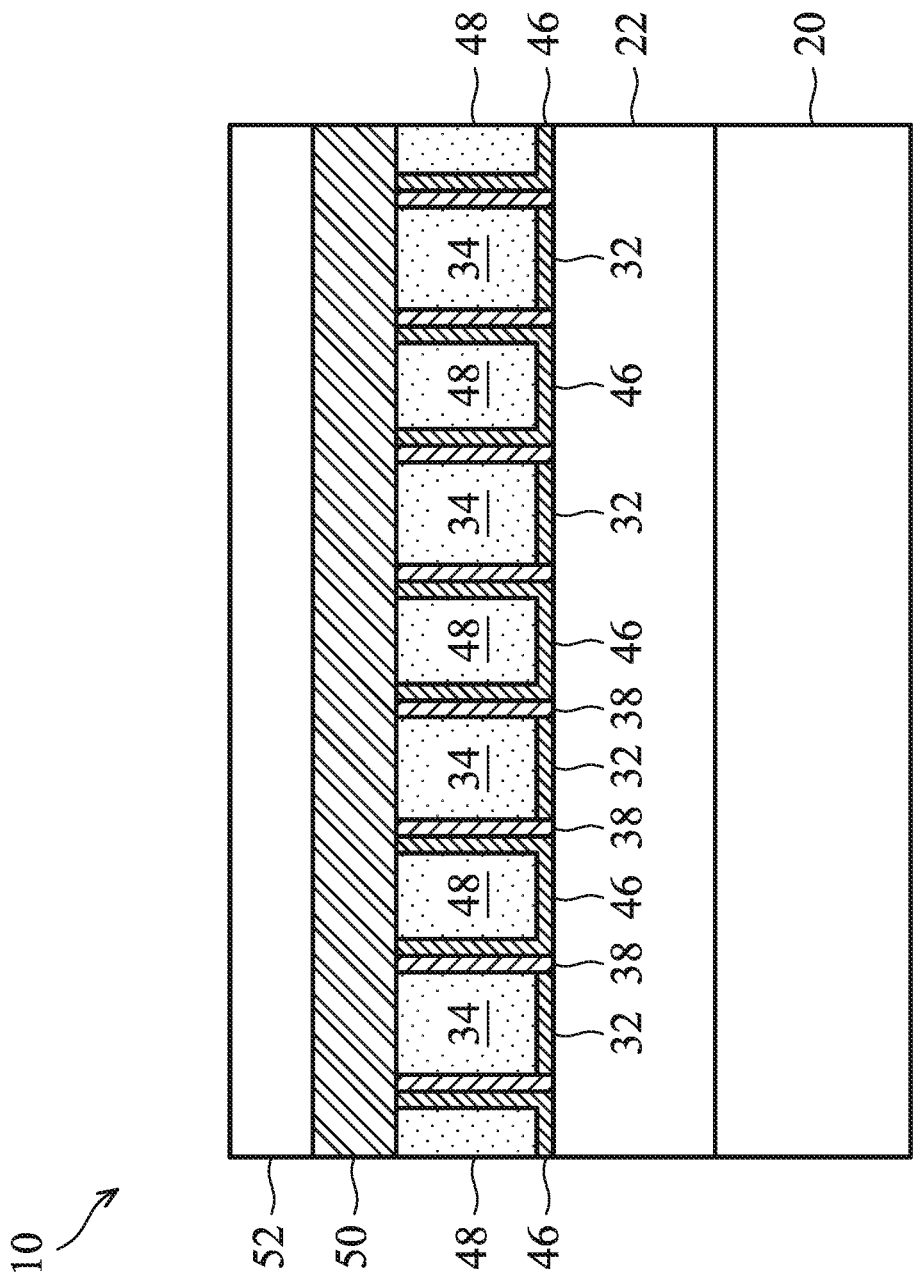
Figure 10B:
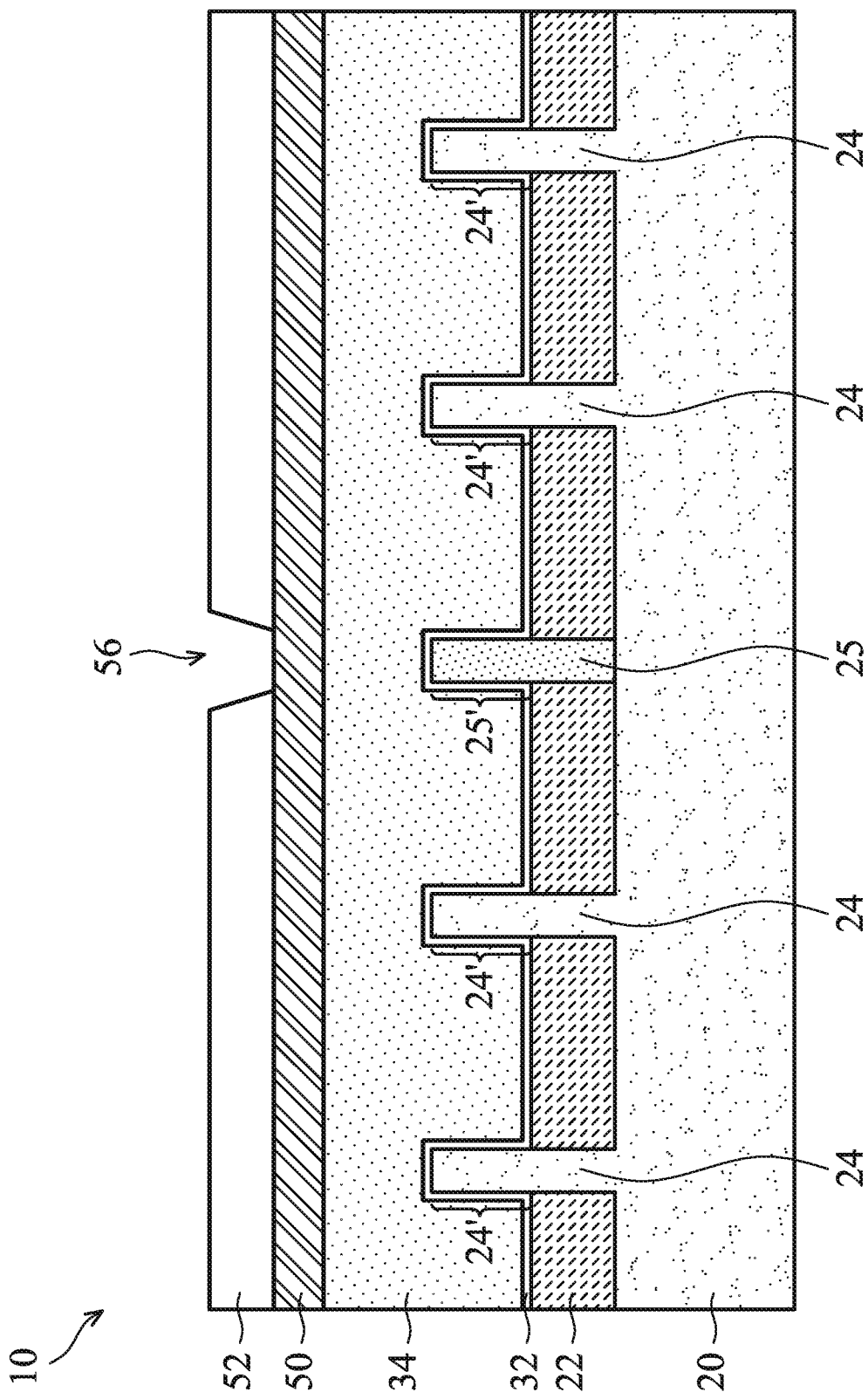
Figure 10C:
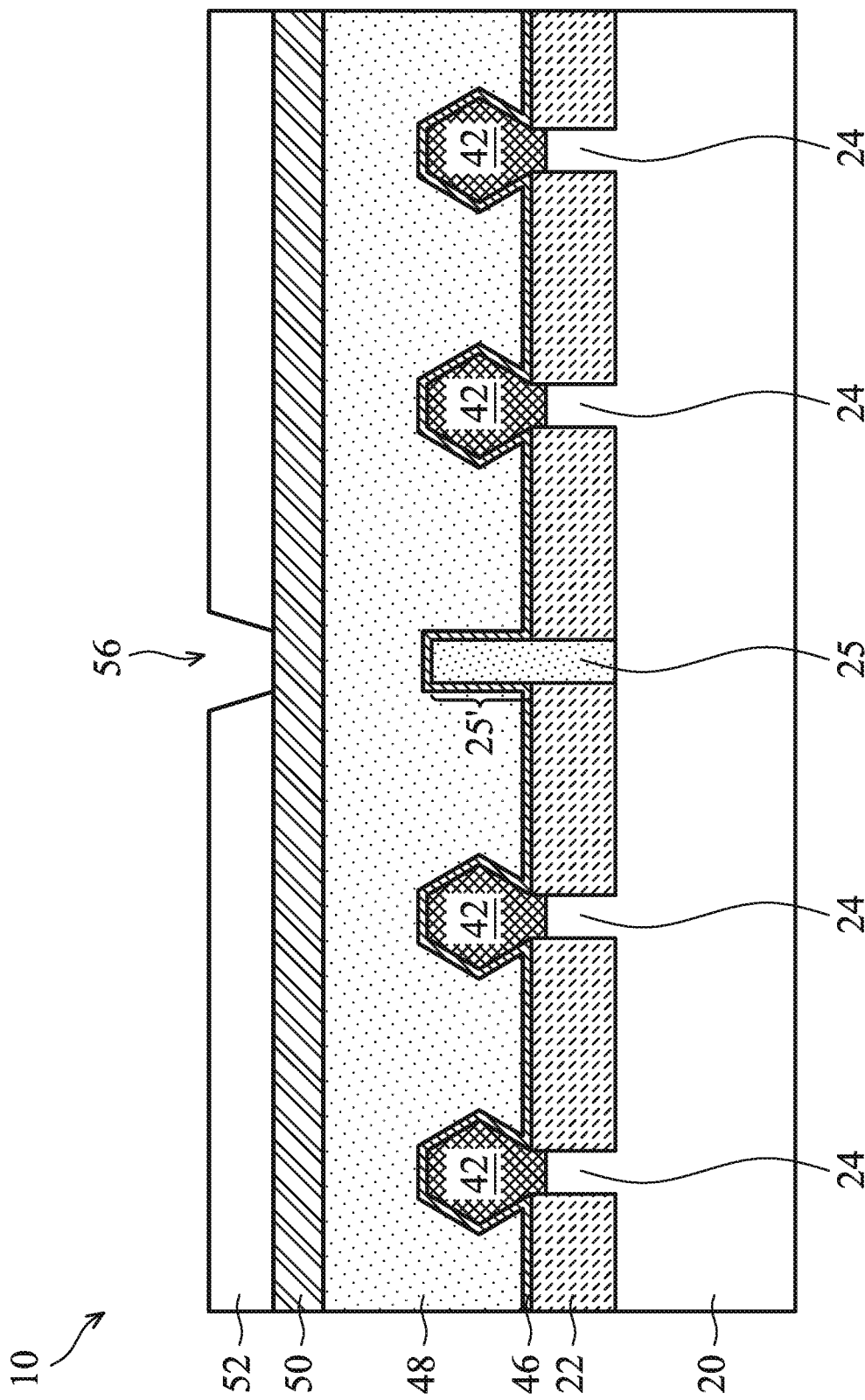

In FIGS. 9, 10A, 10B, and 10C, the photoresist structure 52 is patterned to form one or more gate isolation openings 56 that expose the mask layer 50, in accordance with some embodiments. FIG. 9 illustrates a perspective view of the structure having one gate isolation opening 56, and FIGS. 10A-10C illustrate cross-sectional views of the structure. The gate isolation openings 56 are used to subsequently form gate isolation regions 60 (see FIGS. 15A-15C). As such, the gate isolation openings 56 may be located over one or more dummy gate stacks 30 (see FIG. 10A) and/or over one or more dielectric dummy fins 25 (see FIGS. 10B and 10C).

The photoresist structure 52 can be patterned to form gate isolation openings 56 using acceptable photolithography techniques. After the photoresist structure 52 is patterned, a trimming process may be performed on the patterned photoresist structure 52. In an embodiment, the trimming process is an anisotropic plasma etch process with process gases including $O_2$, $CO_2$, $N_2/H_2$, $H_2$, the like, a combination thereof, or any other gases suitable for trimming photoresist.

In embodiments in which the photoresist structure 52 is a tri-layer photoresist structure, the top photoresist layer of the tri-layer photoresist 52 may be patterned using any suitable photolithography technique. For example, a photomask (not shown) may be disposed over the top photoresist layer, which may then be exposed to radiation, for example, from a laser beam. Exposure of the top photoresist layer may be performed using an immersion lithography system to increase resolution and decrease the minimum achievable pitch. A bake or cure operation may be performed to harden the top photoresist layer, and a developer may be used to remove either the exposed or unexposed portions of the top photoresist layer depending on whether a positive or negative resist is used. After the patterning of the top photoresist layer of the tri-layer photoresist structure 52, a trimming process may be performed on the top photoresist layer of the tri-layer photoresist structure 52. After the trimming process, the middle and bottom layers may be patterned leaving the patterned tri-layer photoresist structure 52 with gate isolation openings 56, as illustrated in FIGS. 9 and 10A-10C.

Figure 11A:
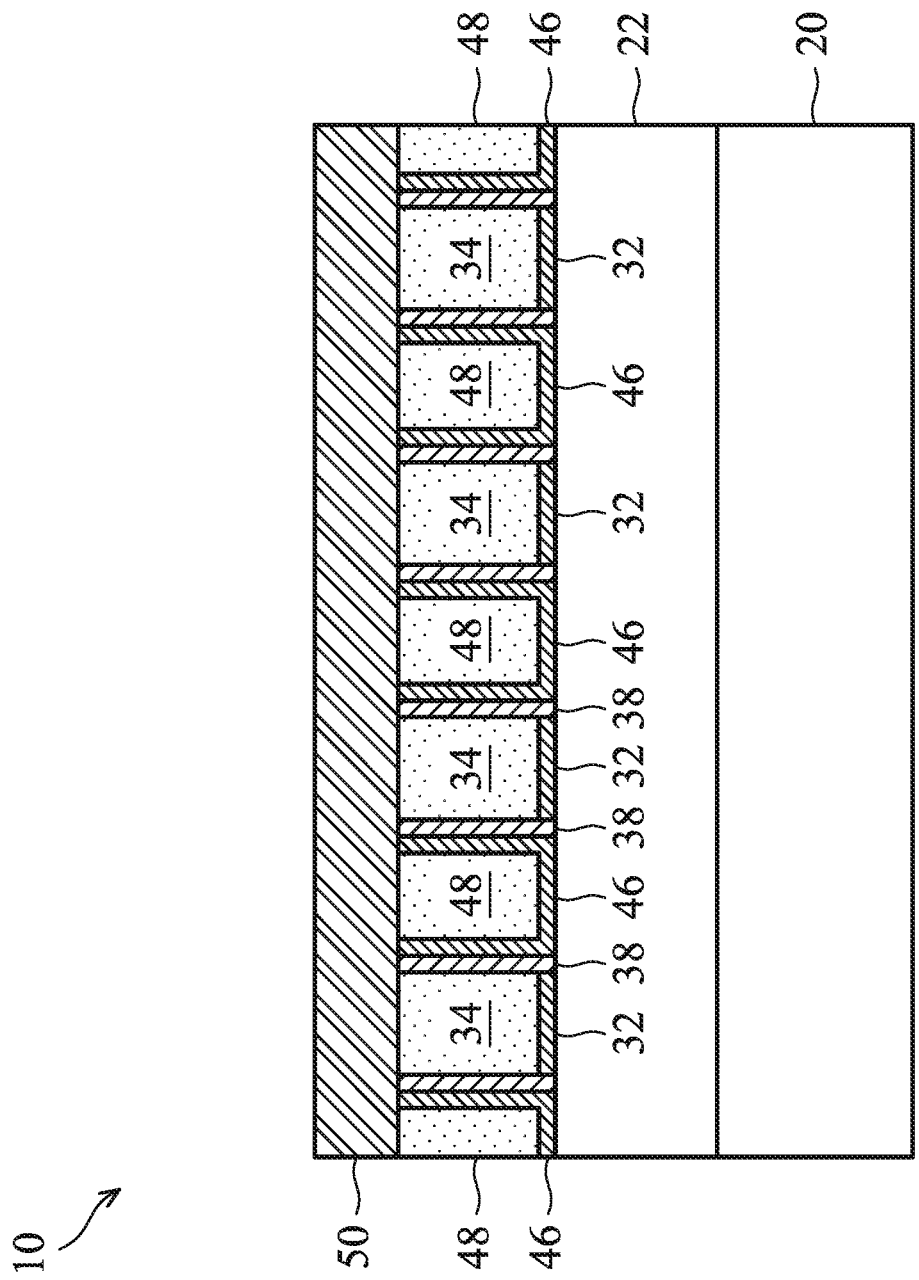
FIGS. 11A, 11B, and 11C illustrate cross-sectional views of intermediate stages in the formation of openings for gate isolation regions of a FinFET device, in accordance with some embodiments.
Figure 11B:
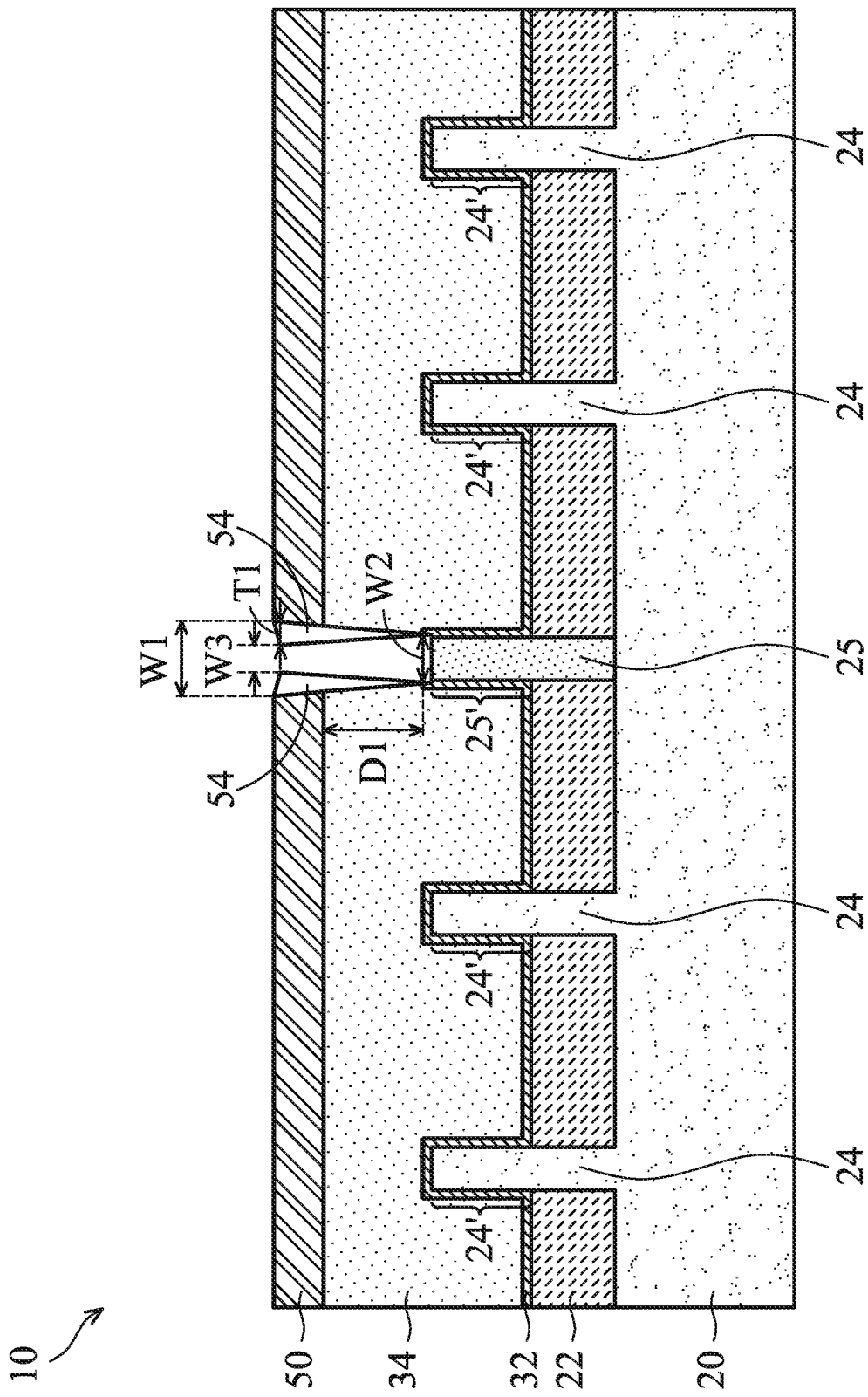
Figure 11C:
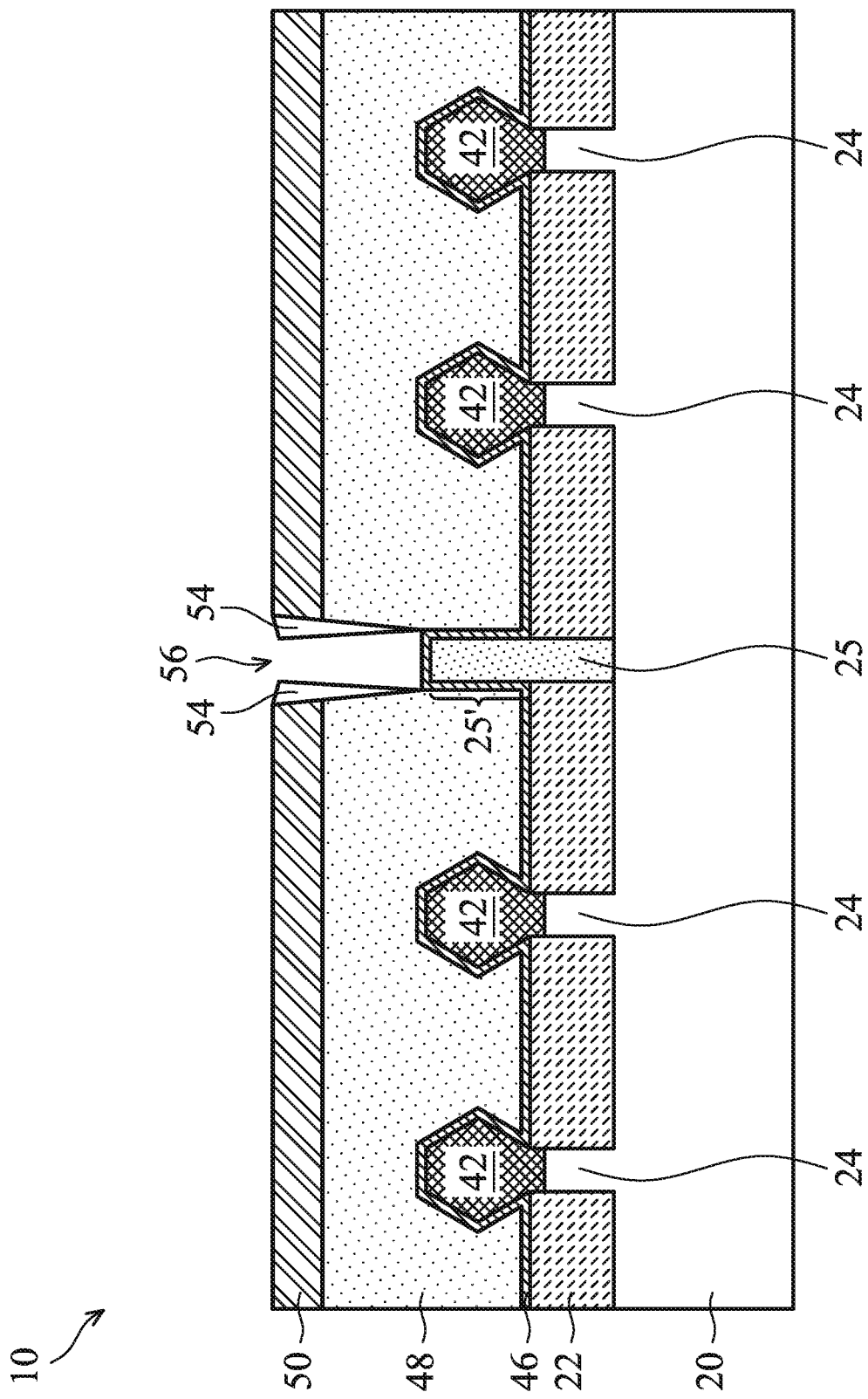

FIGS. 11A, 11B, and 11C illustrate using the patterned photoresist structure 52 as an etching mask to extend the gate isolation opening 56 through the mask layer 50 and into the dummy gate stack 30, in accordance with some embodiments. As shown in FIGS. 11B and 11C, the gate isolation opening 56 may be extended through the dummy gate electrode 34 to the dielectric dummy fin 25. The dielectric dummy fin 25 may be exposed by the gate isolation opening 56, or the dielectric dummy fin 25 may remain covered by the dummy gate dielectric 32. In this manner, the gate isolation opening 56 separates the dummy gate stack 30 of the structure shown in FIGS. 9 and 10A-C into two separate and electrically isolated dummy gate stacks 30. The formation of the gate isolation openings 56 to form separate dummy gate stacks 30 may thus be considered a "gate-cut" process. It should be understood that a single dummy gate stack 30 may be separated into more than two dummy gate stacks 30 by the formation of additional gate isolation openings 56, which may be formed simultaneously. In some embodiments, a gate isolation opening 56 may extend a depth D1 from a top surface of the dummy gate electrode 34 that is between about 15 nm and about 300 nm. These are examples, and other dimensions (e.g., depths) or techniques are possible.

The gate isolation opening 56 may be extended through the mask layer 50 and into the dummy gate stack 30 using one or more suitable etching processes, such as an isotropic dry etching processes, described in greater detail below. In some embodiments, the etching processes may also form sacrificial material 54 on sidewalls of the gate isolation opening 56, described in greater detail below.

In some embodiments, the gate isolation openings 56 have substantially vertical sidewalls or have a substantially uniform width. For example, a gate isolation opening 56 may have an upper width W1 at or near the top of the gate isolation opening 56 that is about the same as a lower width W2 at or near the bottom of the gate isolation opening 56. In some embodiments, the gate isolation openings 56 have angled sidewalls or have a tapered width, as shown in FIGS. 11B and 11C. For example, a gate isolation opening 56 may have an upper width W1 that is larger than its lower width W2. In some embodiments, the lower width W2 of a gate isolation opening 56 may be smaller than, about the same as, or larger than a width of a corresponding dielectric dummy fin 25.

In some embodiments, the etching process used to extend the gate isolation openings 56 into the dummy gate electrode 34 also forms a sacrificial material 54 on sidewalls of the gate isolation openings 56. The sacrificial material 54 may be formed from reaction products depositing on the sidewalls during the etching process. In some embodiments, these reaction products may be formed by chemical reactions between the etched material and the various process gases used during the etching process. For example, the sacrificial material 54 may comprise, for example, an oxide, a nitride, a polymer, the like, a combination thereof. In some embodiments, the sacrificial material 54 is formed as a product from reactions between process gases used during the etching process and/or from reactions between the processes gases and the material of the dummy gate electrode 34. For example, the sacrificial layer 54 may comprise reaction products such as $SiO_x$, $SiN_x$, $SiBr_xO_y$, $SiO_xCl_y$, the like, or combinations thereof. Reaction products such as these examples may be formed from reactions involving etchant gases such as $Cl_2$, HBr, $N_2$ or the like, and/or polymer gases such as $O_2$, $CO_2$, $SO_2$, HBr, $N_2$, or the like, and/or the material of the dummy gate electrode 34 such as those described previously. Other gases, reactions, or reaction products than these examples may be used to form the sacrificial material 54. Some other examples of process gases that may be used in the etching process are described below.

During the etching process, the sacrificial material 54 may form on exposed surfaces, including on existing sacrificial material 54. Thus, regions of a gate isolation opening 56 that are formed relatively early during the etching process can have a thicker build-up of sacrificial material 54 than regions formed relatively late during the etching process. This can result in the thickest portions of the sacrificial material 54 being near the top of the gate isolation opening 56, with the thickness of the sacrificial material 54 decreasing with the depth of the gate isolation opening 56. This is illustrated in FIGS. 11B and 11C, which show upper regions of the gate isolation opening 56 having thicker sacrificial material 54 than lower regions of the gate isolation opening 56. In some embodiments, upper regions of a gate isolation opening 56 may have a thickness T1 of the sacrificial material 54 that is between about 1 nm and about 10 nm. These are examples, and other thicknesses or techniques are possible.

In some embodiments, the sacrificial material 54 may be formed such that the presence of the sacrificial material 54 decreases the upper width W1 of the gate isolation opening 56 to a width W3 that is smaller than the upper width W1. In some cases, the width W3 of a gate isolation opening 56 may be about the same as or less than the lower width W2. For example, the overall thickness of the sacrificial material 54 added to sidewalls of the gate isolation opening 56 (e.g., 2×T1) may be larger than the difference (W1–W2) between the upper width W1 and the lower width W2 of the gate isolation opening 56. In this manner, the presence of the sacrificial material 54 may form a gate isolation opening 56 that is narrower near upper regions than near lower regions. In some cases, the presence of the sacrificial material 54 may also decrease the lower width W2. By controlling the thickness or distribution of the sacrificial material 54 on the sidewalls of the gate isolation openings 56, the shape of the subsequently formed gate isolation regions 60 (see FIGS. 15A-C) may be controlled.

In some embodiments, the etching process that extends the gate isolation openings 56 and forms the sacrificial material 54 comprises a plasma etching process. In some embodiments, the plasma etching process includes one or more process gases, which may include one or more etching gases and/or one or more polymer-forming gases. For example, in some embodiments, the etching gases may include $Cl_2$, $BCl_3$, Ar, $CH_4$, $C_2H_2$, $CF_4$, $C_2F_2$, $C_4F_6$, $C_6F_8$, $CHF_3$, $CH_3F$, HBr, $SiCl_4$, $SF_6$, $NF_3$, $N_2$, $CO_2$, $O_2$, the like, or combinations thereof. In some embodiments, the polymer-forming gases may include gases such as $SiCl_4$, $C_4F_6$, $C_4F_8$, $CHF_3$, $C_2H_2$, $CH_3F$, $CH_4$, HBr, $O_2$, $SO_2$, $CO_2$, $N_2$, the like, or combinations thereof. The pressure of the process gases may be in the range between about 3 mTorr and about 300 mTorr, or may be another pressure. The process temperature may be in the range between about 0° C. and about 120° C., or may be another temperature. In some embodiments, the plasma etching process may include a plasma generated with a power between about 0 Watts and about 2500 Watts. However, any other suitable process gases, etching techniques, or process parameters may be used in other embodiments. In some embodiments, some of or all of the photoresist structure 52 may be consumed during the plasma etching process. The plasma etching process may include multiple cycles using various etchants effective for the etching of the gate isolation openings 56 and the formation of the sacrificial material 56. Other process gases or process conditions may be used and are considered within the scope of this disclosure.

In some embodiments, the types, proportions, or flow rates of the process gases may be controlled to control the formation of the sacrificial material 54 on the sidewalls of the gate isolation openings 56. For example, a larger proportion or a larger flow rate of polymer-forming gases during the plasma etching process may form a sacrificial material 54 having a greater thickness (e.g., T1), which can reduce the width W3. In some embodiments, the types, proportions, or flow rates of the process gases may be controlled or changed during the etching process to control the formation of the sacrificial material 54. The variation of the thickness of the sacrificial material 54 within the gate isolation openings 56 may be controlled in this manner, and thus the angle the surface of the sacrificial material 54 makes with respect to the vertical may be controlled, or the thickness profile of the sacrificial material 54 within the gate isolation openings 56 may be controlled.

Figure 12:
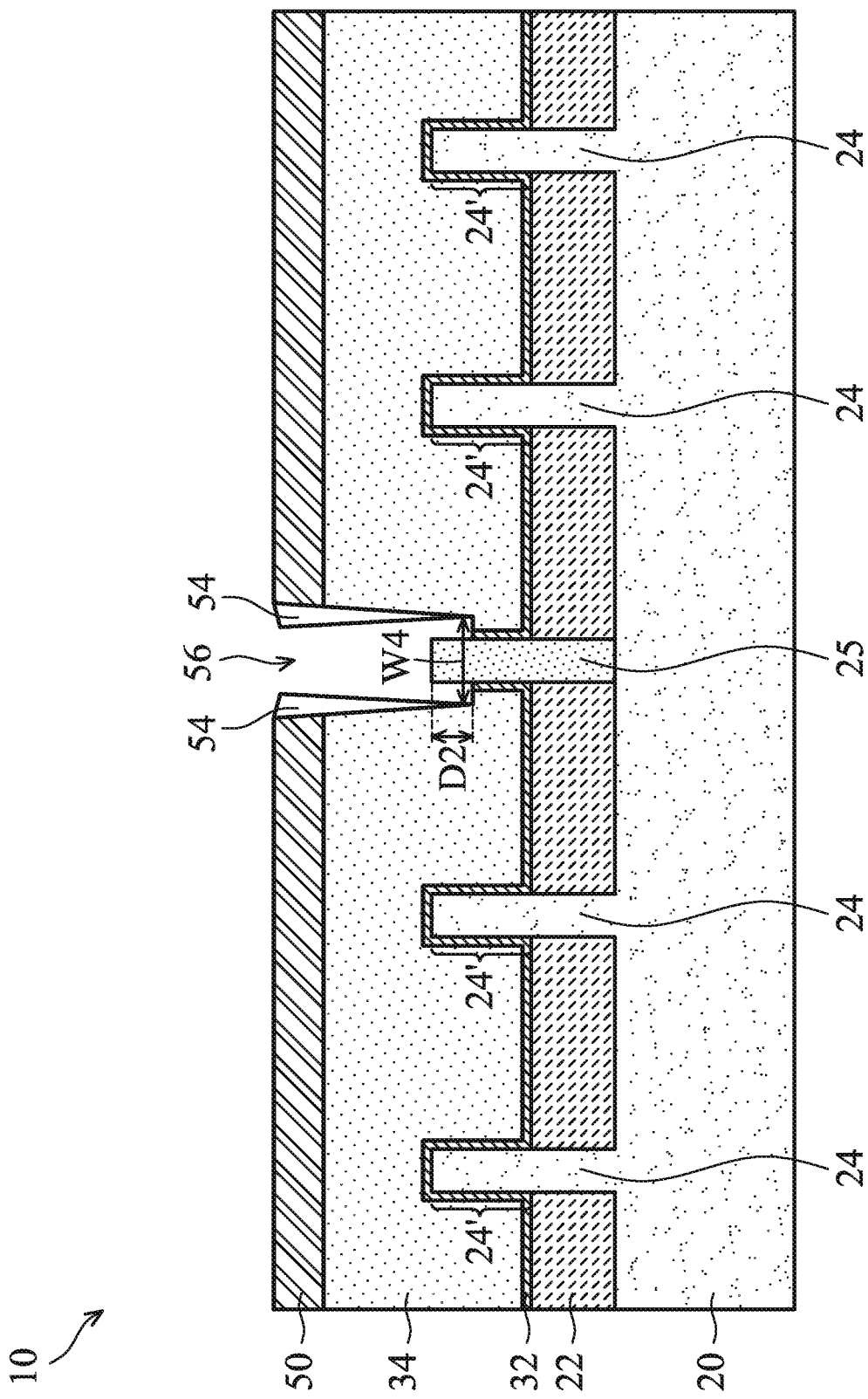
FIGS. 12 and 13 illustrate cross-sectional views of intermediate stages in the formation of openings for gate isolation regions of a FinFET device, in accordance with other embodiments.
Figure 13:
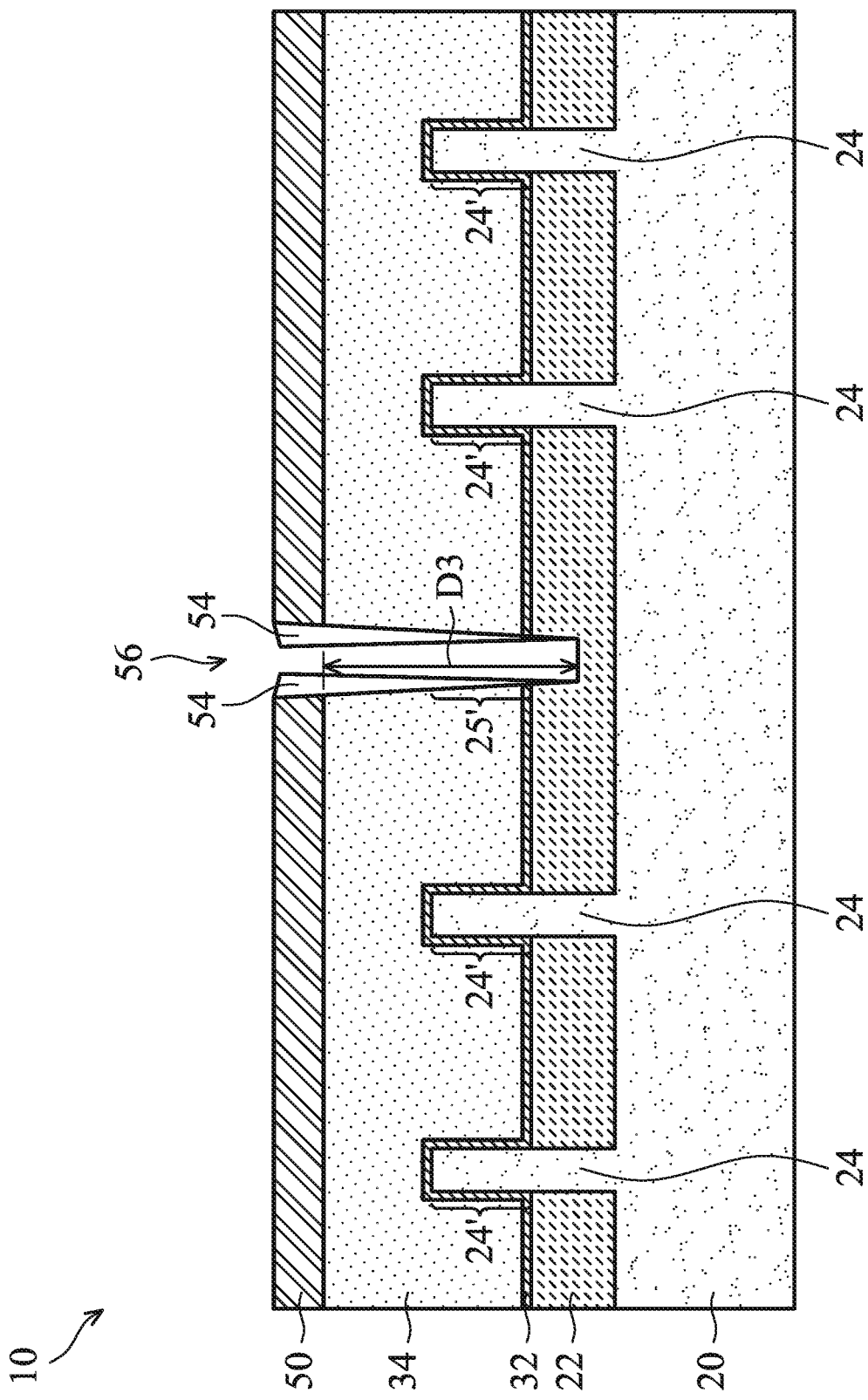

FIGS. 12 and 13 illustrate gate isolation openings 56 in accordance with alternative embodiments. The gate isolation openings 56 shown in FIGS. 12 and 13 are shown in a cross-sectional view similar to FIG. 11B. FIG. 12 illustrates an embodiment in which the bottom of the gate isolation opening 56 extends below the top of the dielectric dummy fin 25. As shown in FIG. 12, the etching process may remove portions of the dummy gate dielectric 32. In some embodiments, the gate isolation opening 56 may extend a distance D2 below a top surface of the dielectric dummy fin 25 that is between about 0 nm and about 100 nm. The gate isolation opening 56 may extend to the STI regions 22 or into the STI regions 22, in some embodiments. The gate isolation opening 56 may also have a bottom width W4 that is greater than the width of the dielectric dummy fin 25. In some embodiments, the gate isolation opening 56 may have a bottom width W4 that is between about 10 nm and about 70 nm. These are examples, and other sizes, shapes, or dimensions are possible.

FIG. 13 illustrates an embodiment in which the gate isolation opening 56 extends into the STI regions 22. FIG. 13 also shows an embodiment in which no dielectric dummy gate 25 is present, but a dielectric dummy gate 25 or a fin 24 may be present under the gate isolation opening 56 in this embodiment and in other embodiments described herein. In some embodiments, the gate isolation opening 56 may extend a distance D3 below a top surface of the dummy gate electrode 34 that is between about 20 nm and about 400 nm. In some embodiments, the gate isolation opening 56 may extend fully through the STI regions 22 and into the substrate 20. These are examples, and other sizes, shapes, or dimensions are possible.

Figure 14A:
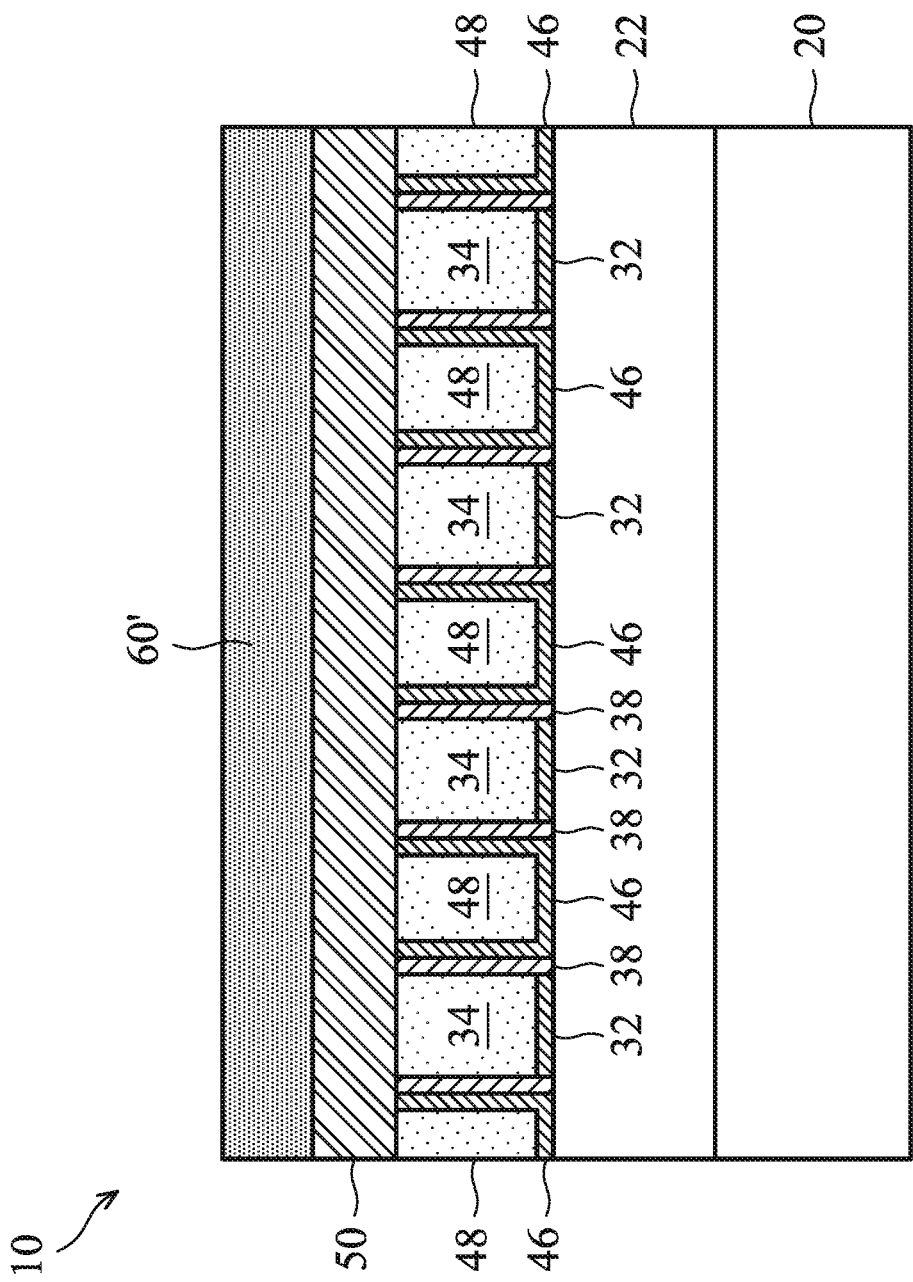
FIGS. 14A, 14B, 14C, 15A, 15B, 15C, 16A, and 16B illustrate cross-sectional views of intermediate stages in the formation of gate isolation regions of a FinFET device, in accordance with some embodiments.
Figure 14B:
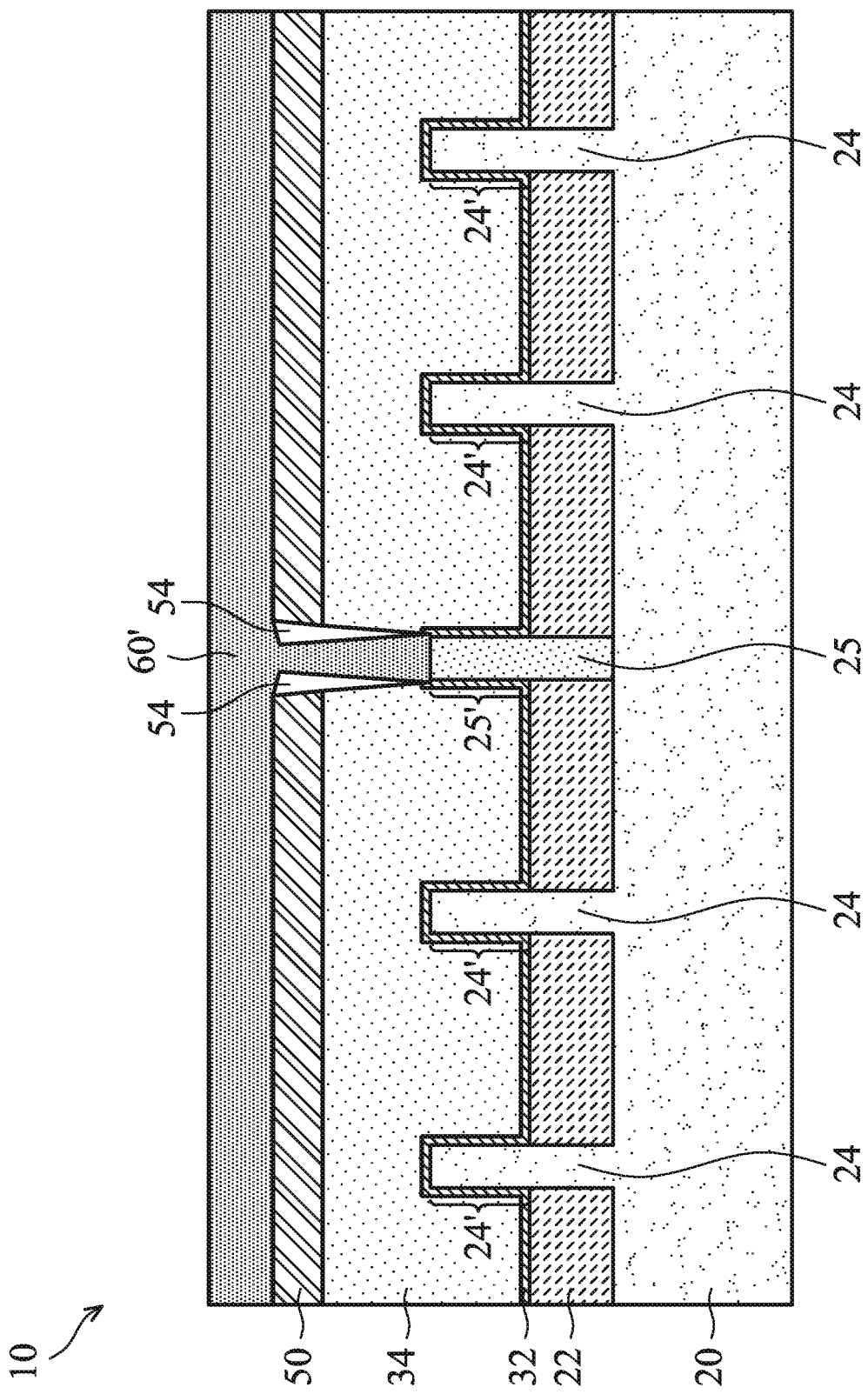
Figure 14C:
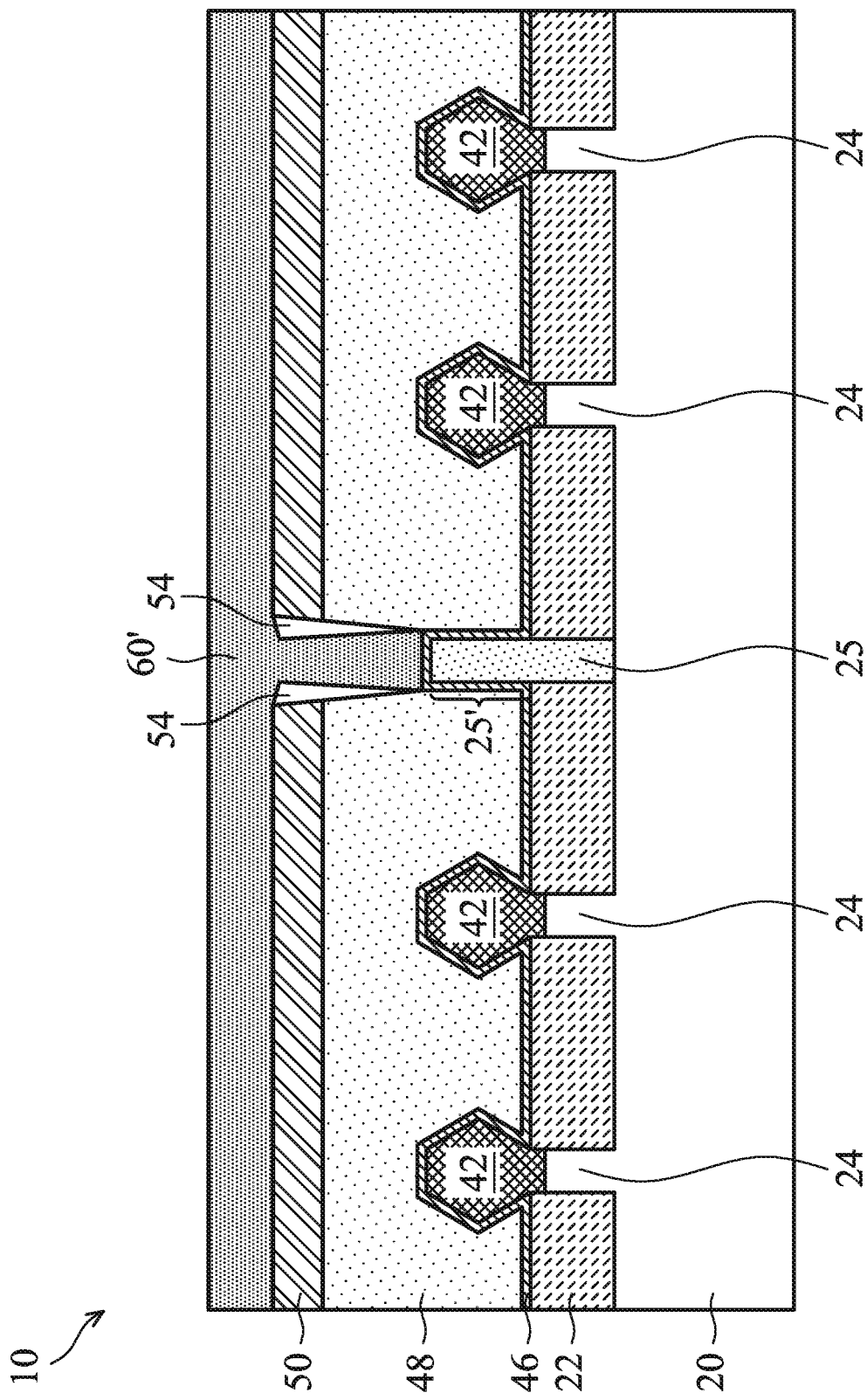

In FIGS. 14A, 14B, and 14C, a dielectric material 60' is formed within the gate isolation openings 56 and over the structure, in accordance with some embodiments. The dielectric material 60' may be an oxide, such as silicon oxide, a nitride, such as a silicon nitride or silicon oxynitride, the like, or a combination thereof. The dielectric material 60' may be formed by a suitable process such as CVD, HDP-CVD, FCVD, the like, or a combination thereof. These or other dielectric materials may be formed by any acceptable process. The dielectric material 60' may be a material different from the sacrificial material 54 such that the sacrificial material 54 may be selectively etched from the dielectric material 60'.

Figure 15A:
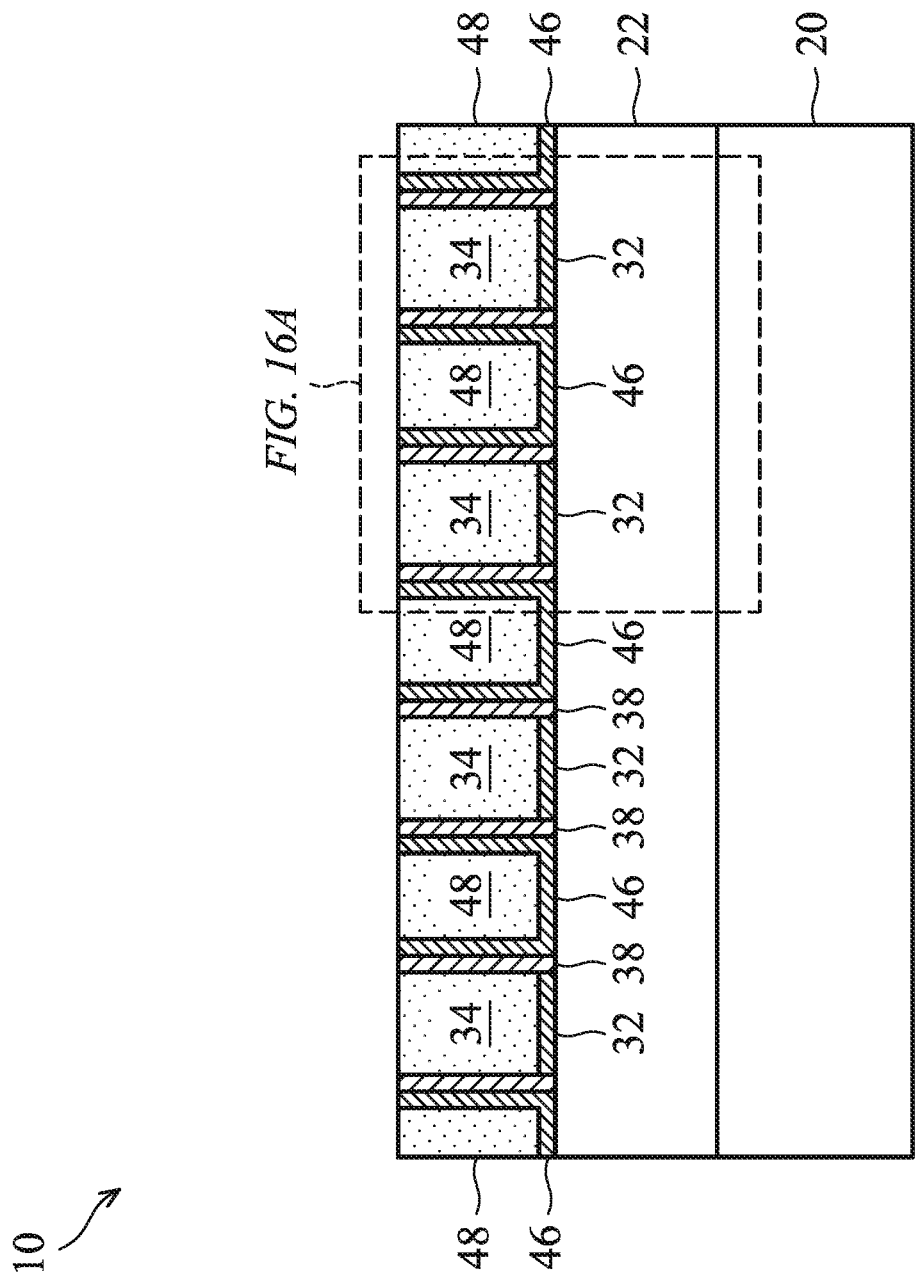
Figure 15B:
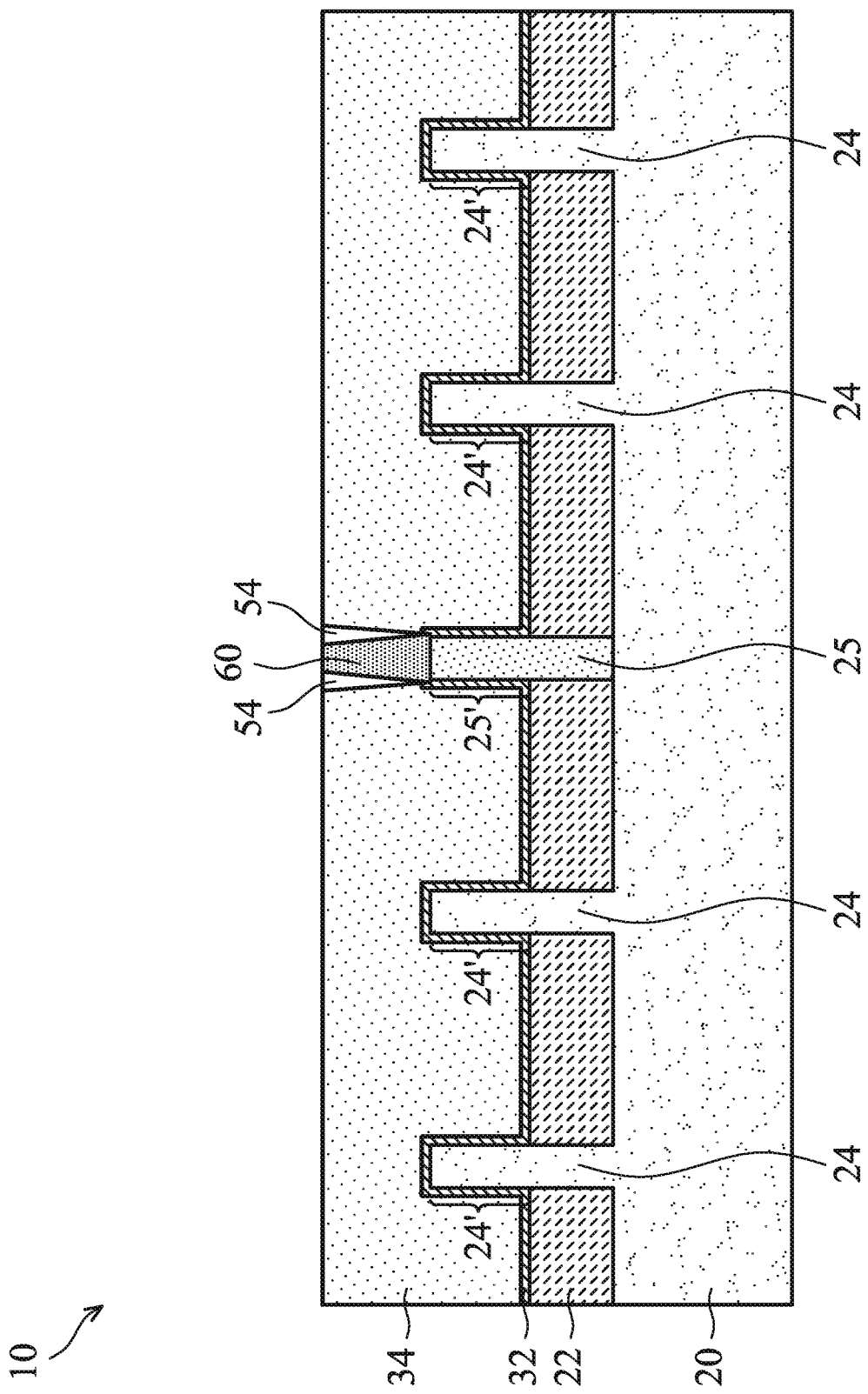
Figure 15C:
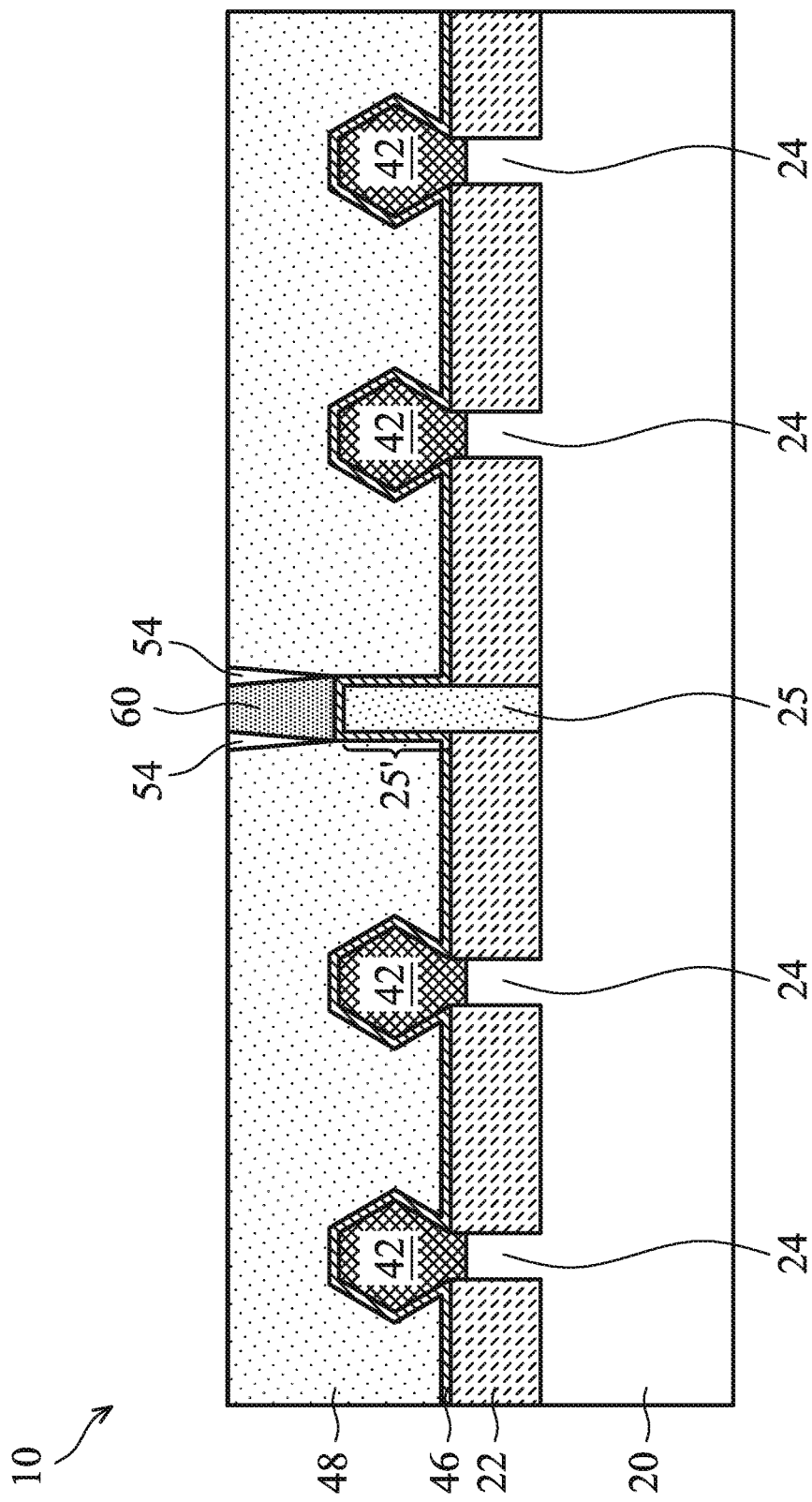

In FIGS. 15A, 15B, and 15C, a planarization process is performed to form gate isolation regions 60, in accordance with some embodiments. The planarization process removes excess dielectric material 60' from the surface of the structure, with the remaining portions of the dielectric material 60' within the gate isolation openings 56 forming the gate isolation regions 60. In some embodiments, the planarization process comprises an etching process, such as a wet etching process or a dry etching process, a CMP process, a mechanical grinding process, the like, or a combination thereof. Surfaces of the gate isolation regions 60 and the sacrificial material 54 may be exposed after the planarization process, and may be level with the dummy gate electrode 34 or the first ILD 48. The gate isolation regions 60 provide isolation between dummy gate stacks 30 and between subsequently formed replacement gates (see FIGS. 18A-C).

Figure 16A:
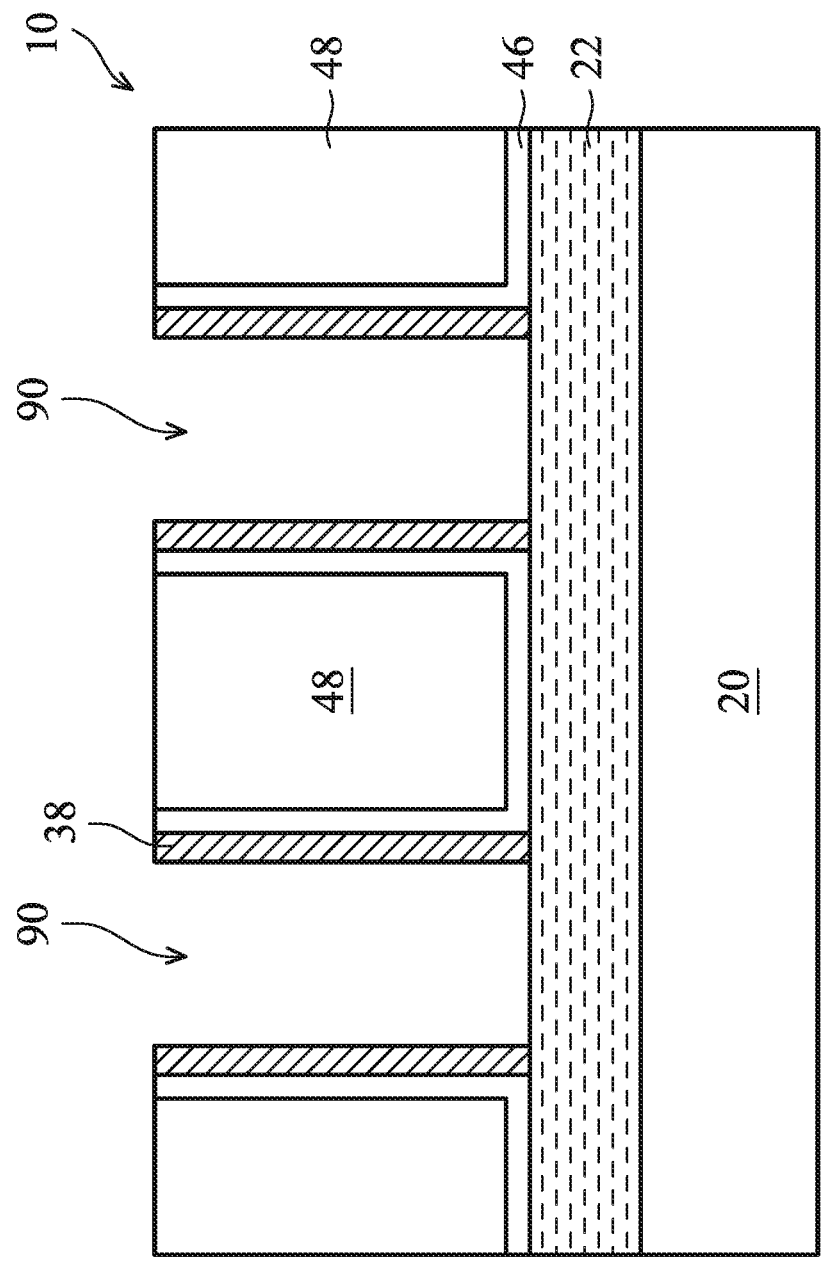
Figure 16B:
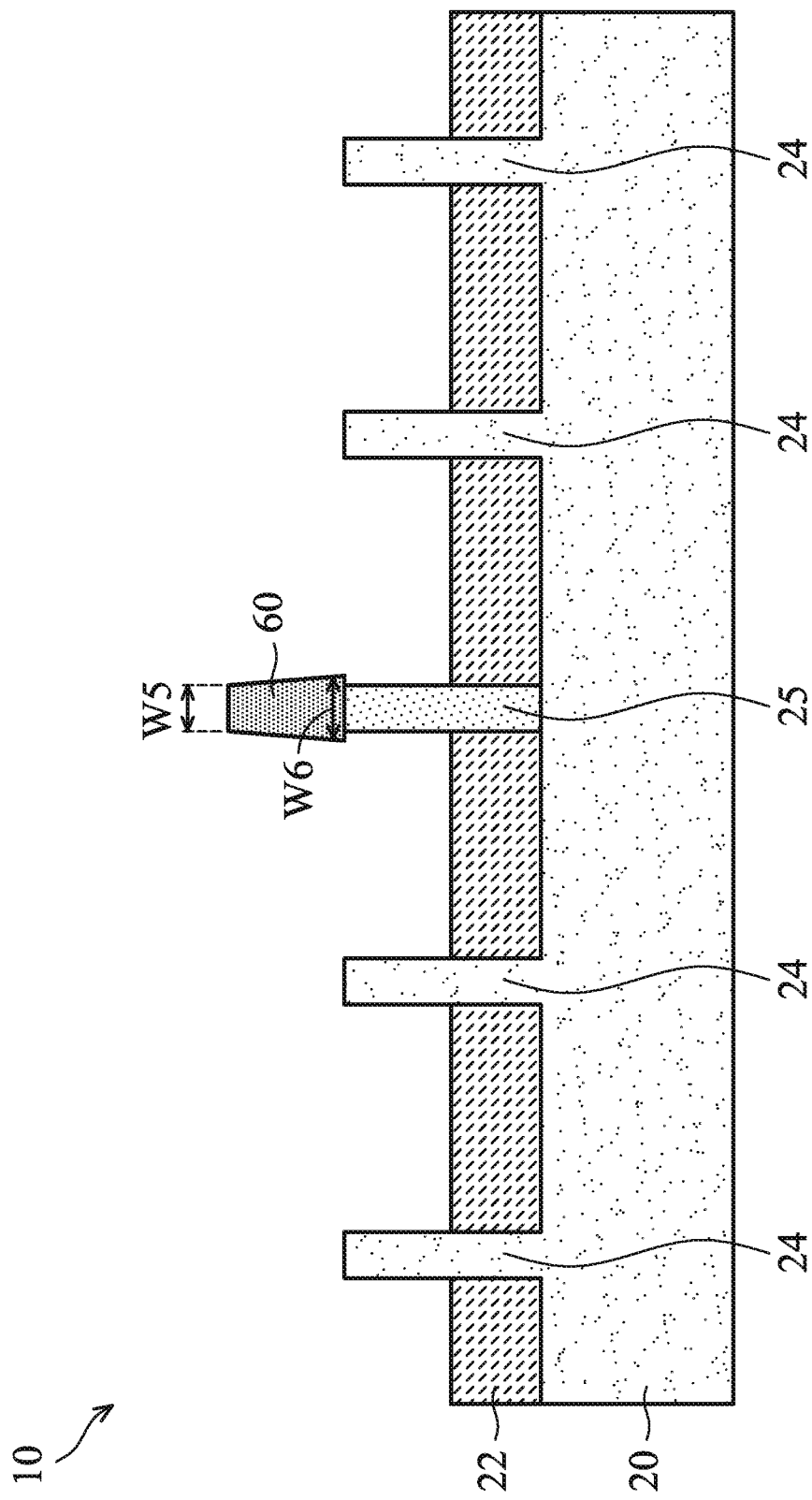

In FIGS. 16A and 16B, the dummy gate dielectric 32, the dummy gate electrode 34, and the sacrificial material 54 are removed, in accordance with some embodiments. FIG. 16A shows a magnified portion of the structure of FIG. 15A as indicated in FIG. 15A, and FIGS. 17A, 18A, 19A, and 20A also show this magnified portion. In some embodiments, the dummy gate dielectric 32, the dummy gate electrode 34, and the sacrificial material 54 are removed using an anisotropic dry etch process. For example, the etching process may include a dry etch process using reaction gas(es) that selectively etches the dummy gate dielectric 32, the dummy gate electrode 34, and the sacrificial material 54 without etching the gate isolation regions 60, the first ILD 48, or the gate spacers 38. In some embodiments, a wet etch process or an oxide removal process may be used. In some embodiments, the dummy gate dielectric 32 is removed from recesses 90 in a first region of a die (e.g., a core logic region) and remains in recesses 90 in a second region of the die (e.g., an input/output region). The removal of the dummy gate dielectric 32 and the dummy gate electrode 34 forms a recess 90 that exposes a channel region of a respective fin 24. During the removal, the dummy gate dielectric 32 may be used as an etch stop layer when the dummy gate electrodes 34 are etched. The dummy gate dielectric 32 may then optionally be removed after the removal of the dummy gate electrodes 34.

As shown in FIG. 16B, the gate isolation regions 60 remain after the removal of the dummy gate dielectric 32, the dummy gate electrode 34, and the sacrificial material 54. The remaining gate isolation regions 60 may have the approximate dimensions and profile as portions of the corresponding gate isolation openings 56 including the sacrificial material 54. This is also the case for gate isolation openings 56 having different shapes or sizes, such as those shown in FIGS. 12 and 13. By controlling the etching of the gate isolation openings 56 and the formation of the sacrificial material 54, the shape and size of the gate isolation regions 60 may be controlled. Due to the presence of the sacrificial material 54, the gate isolation regions 60 may be formed having a top width W5 that is about the same as or less than a bottom width W6. Thus, the gate isolation regions 60 may be formed having vertical sidewalls, or may be formed having angled sidewalls or a tapered width. In some embodiments, the top width W5 may be between about 1 nm and about 70 nm, and the bottom width W6 may be between about 10 nm and about 70 nm. The bottom width W6 may be about the same as the lower width W2 of the corresponding gate isolation opening 56, in some cases. The bottom width W6 of a gate isolation region 60 may be smaller than, about the same as, or larger than a width of a corresponding dielectric dummy fin 25. These are examples, and other sizes, shapes, or dimensions are possible.

In some cases, forming a gate isolation region having a top width that is larger than a bottom width can cause a "shadowing" effect to occur during anisotropic etching or subsequent deposition steps due to the larger top width. This shadowing effect can cause residue on surfaces of the gate isolation region or the dielectric dummy fin to be incompletely removed during etching steps or cleaning steps. For example, the residue may include oxide, polymer, material from the photoresist structure 52 or mask layer 50, residue from subsequently deposited materials (e.g., subsequently deposited anti-reflection coatings or other materials), the like, or combinations thereof. The presence of this residue can cause undesirable voltage threshold shifts in a FinFET device, incomplete or inefficient metal fill in subsequent deposition steps, and reduced device performance. By forming the gate isolation regions 60 having a top width W5 that is less than the bottom width W6, as shown in FIG. 16B, the shadowing effect can be reduced or eliminated, allowing greater residue removal or complete residue removal and allowing for improved metal fill. Thus, the formation of gate isolation regions 60 as described herein can improve device performance, consistency, and reliability.

Figure 17A:
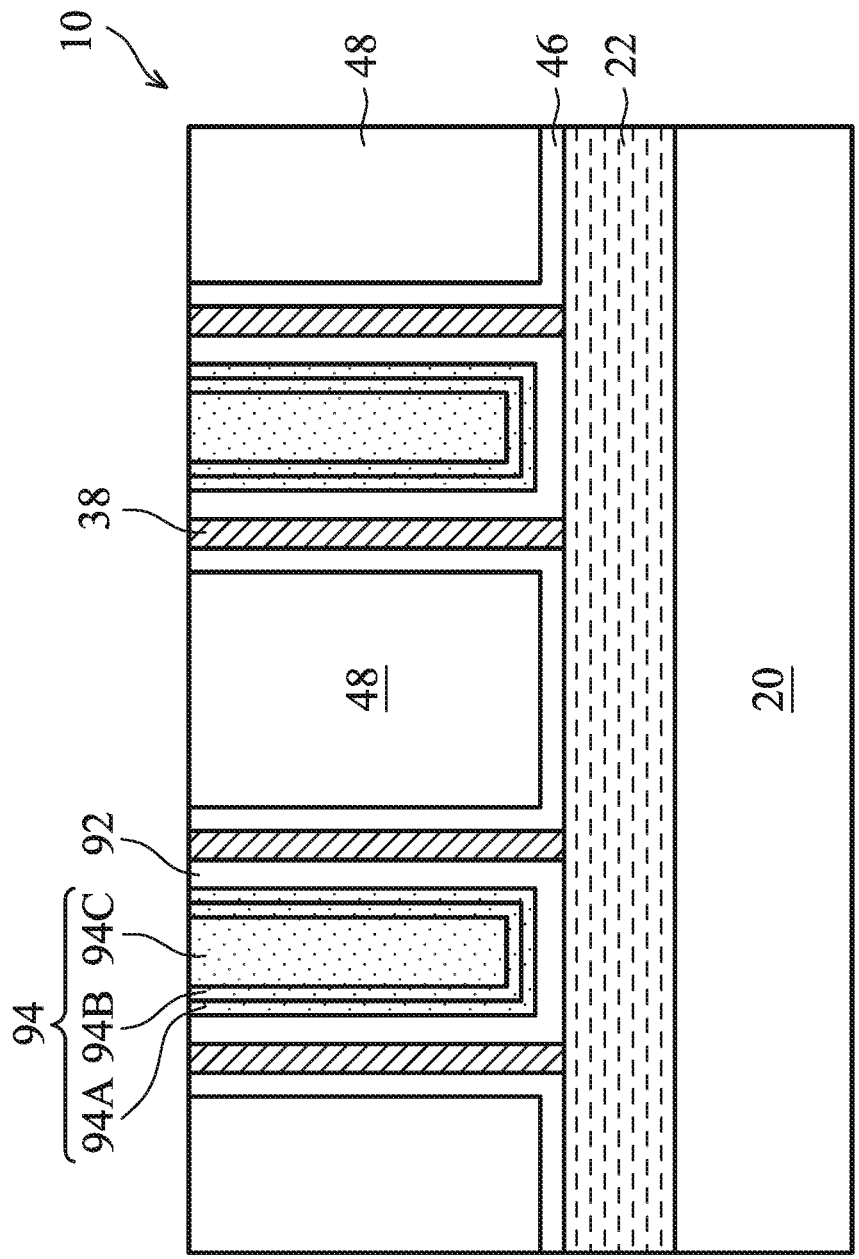
FIGS. 17A, 17B, 18A, 18B, 18C, 19A, 19B, 19C, 20A, 20B, and 20C illustrate cross-sectional views of intermediate stages in the formation of a FinFET device having gate isolation regions, in accordance with some embodiments.
Figure 17B:
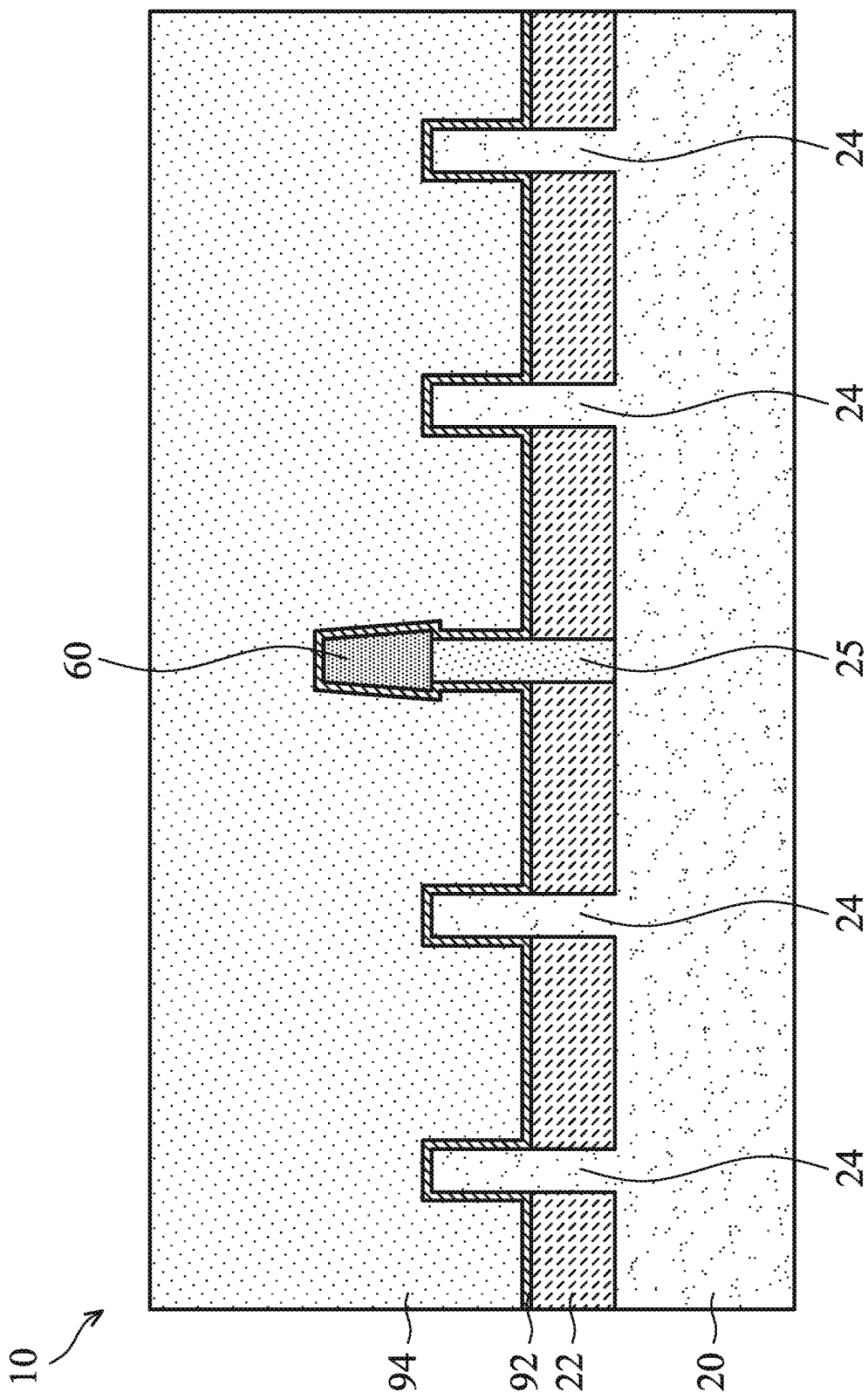

In FIGS. 17A and 17B, gate dielectric layers 92 and gate electrodes 94 are formed for replacement gates. Gate dielectric layers 92 are deposited conformally in the recesses 90, such as on the top surfaces and the sidewalls of the fins 24 and on sidewalls of the gate spacers 38. The gate dielectric layers 92 may also be formed on the top surface of the first ILD 48. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 32 remains in the recesses 90, the gate dielectric layers 92 include a material of the dummy gate dielectric 32 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 17B, the gate electrode 94 may comprise any number of liner layers 94A, any number of work function tuning layers 94B, and a fill material 94C as illustrated by FIG. 17A. After the filling of the recesses 90, a planarization process, such as a CMP, may be performed to remove the excess portions of the gate dielectric layers 92 and the material of the gate electrodes 94, which excess portions are over the top surface of the ILD 48. The remaining portions of material of the gate electrodes 94 and the gate dielectric layers 92 thus form replacement gates of the resulting FinFETs. The gate electrodes 94 and the gate dielectric layers 92 may be collectively referred to as a "replacement gate stack" or a "gate stack." The replacement gate stacks may extend along sidewalls of a channel region of the fins 24. The gate isolation regions 60 separate and electrically isolate replacement gate stacks.

The formation of the gate dielectric layers 92 in different regions of the wafer 10 may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 18A:
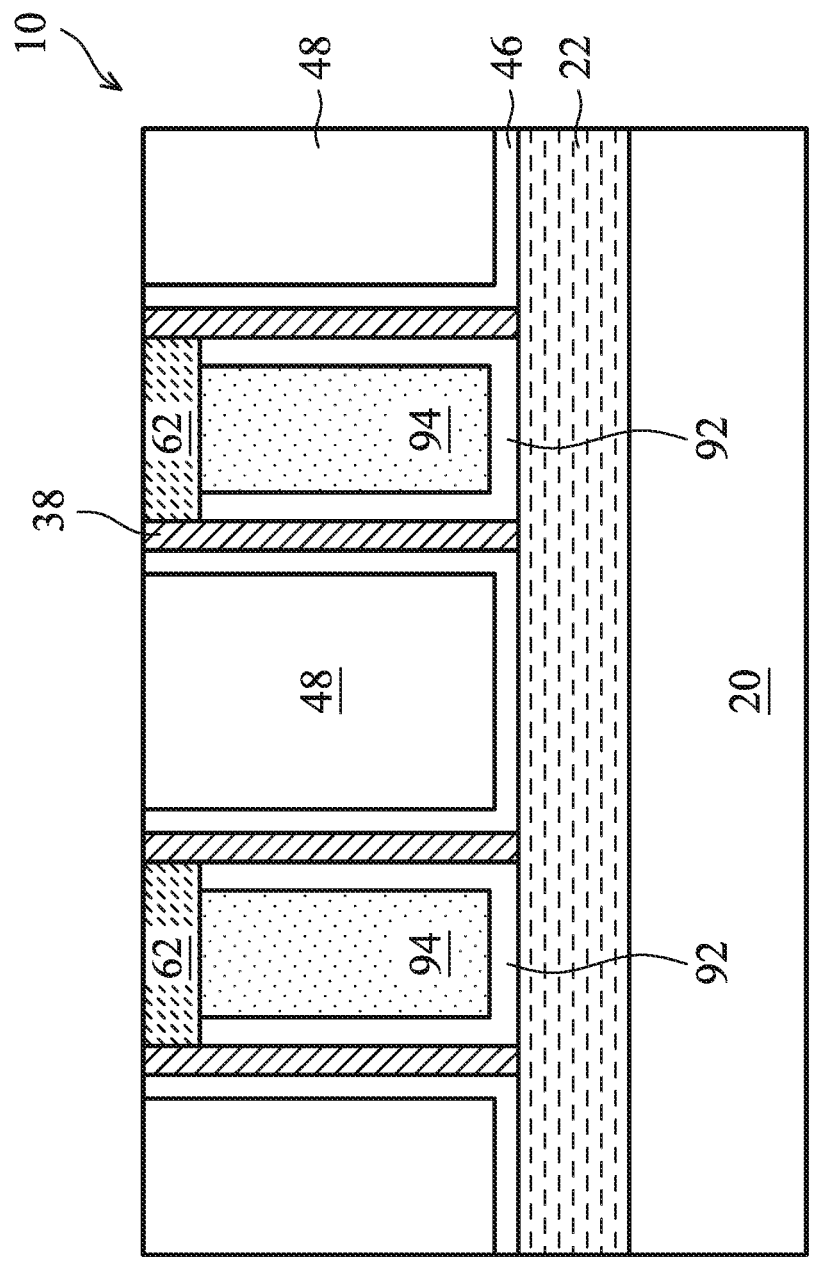
Figure 18B:
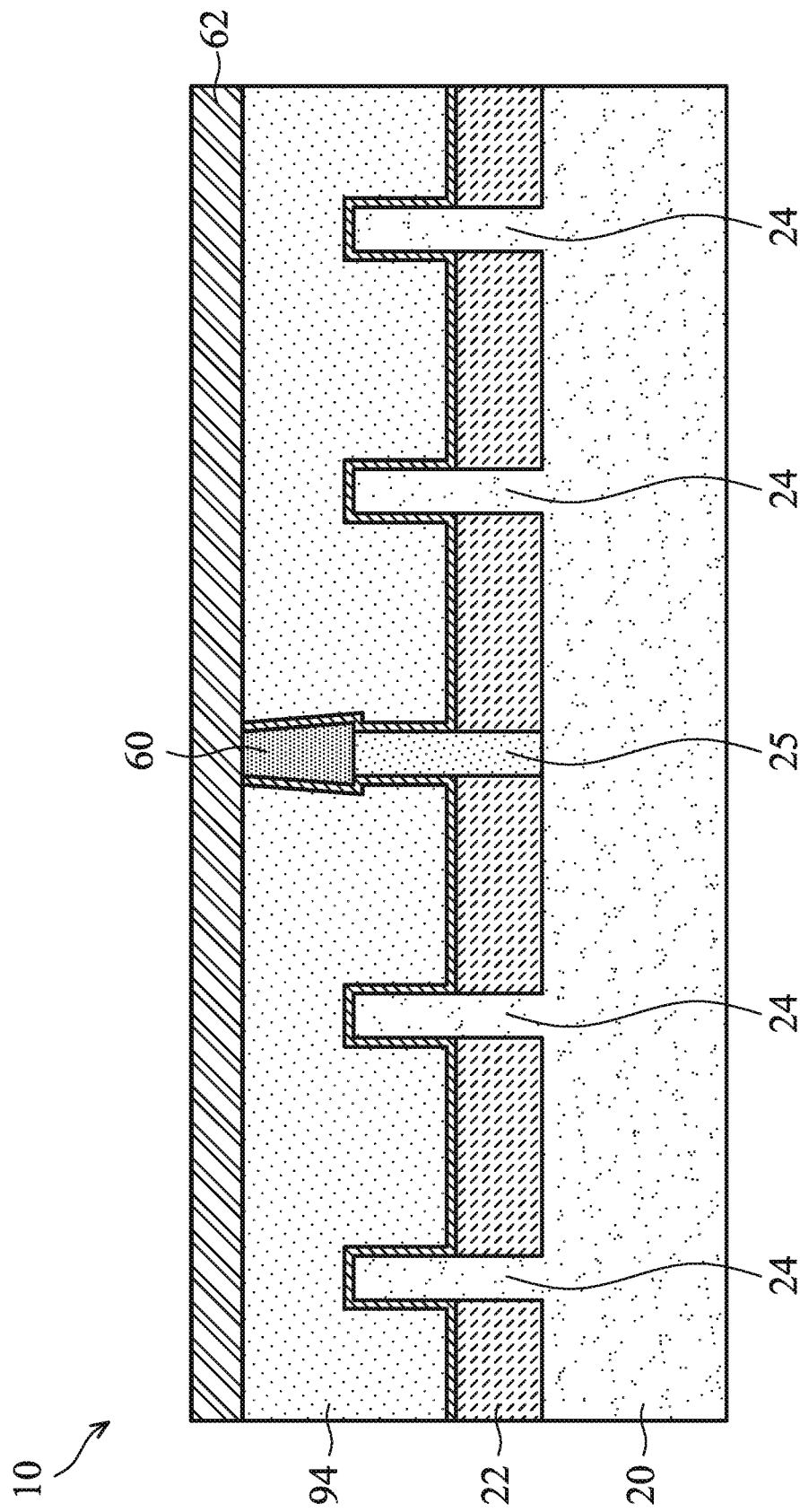
Figure 18C:
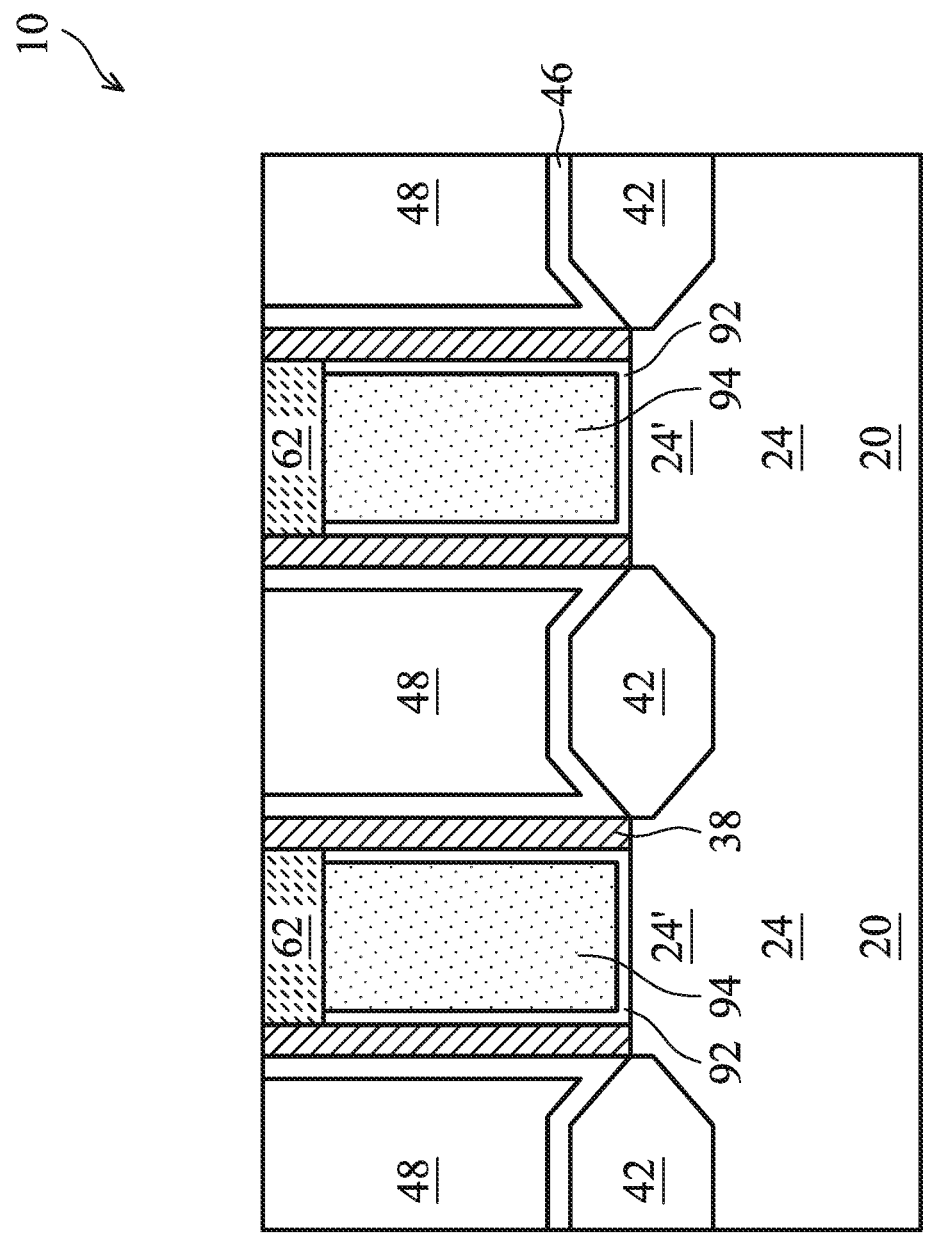

In FIGS. 18A, 18B, and 18C, hard masks 62 are formed over the gate stacks, in accordance with some embodiments. FIG. 18C (and subsequent FIGS. 19C and 20C) are illustrated along cross-section D-D as shown in FIG. 6. In some embodiments, the hard masks 62 are formed of silicon nitride, silicon oxynitride, silicon oxycarbide, silicon oxycarbonitride, the like, or combinations thereof. The formation of the hard masks 62 may include recessing the gate stacks (including gate dielectric layers 92 and corresponding overlying gate electrodes 94) using one or more etching processes to form recesses, so that a recess is formed directly over the gate stack and between opposing portions of gate spacers 38. Then, a dielectric material is filled into the recesses, and planarization process is performed to remove the excess portions of the dielectric material. The remaining portions of the dielectric material are the hard masks 62. The subsequently formed gate contacts 110 (FIGS. 20A-20C) penetrate through the hard masks 62 to contact the top surface of the recessed gate electrode 94.

Figure 21:
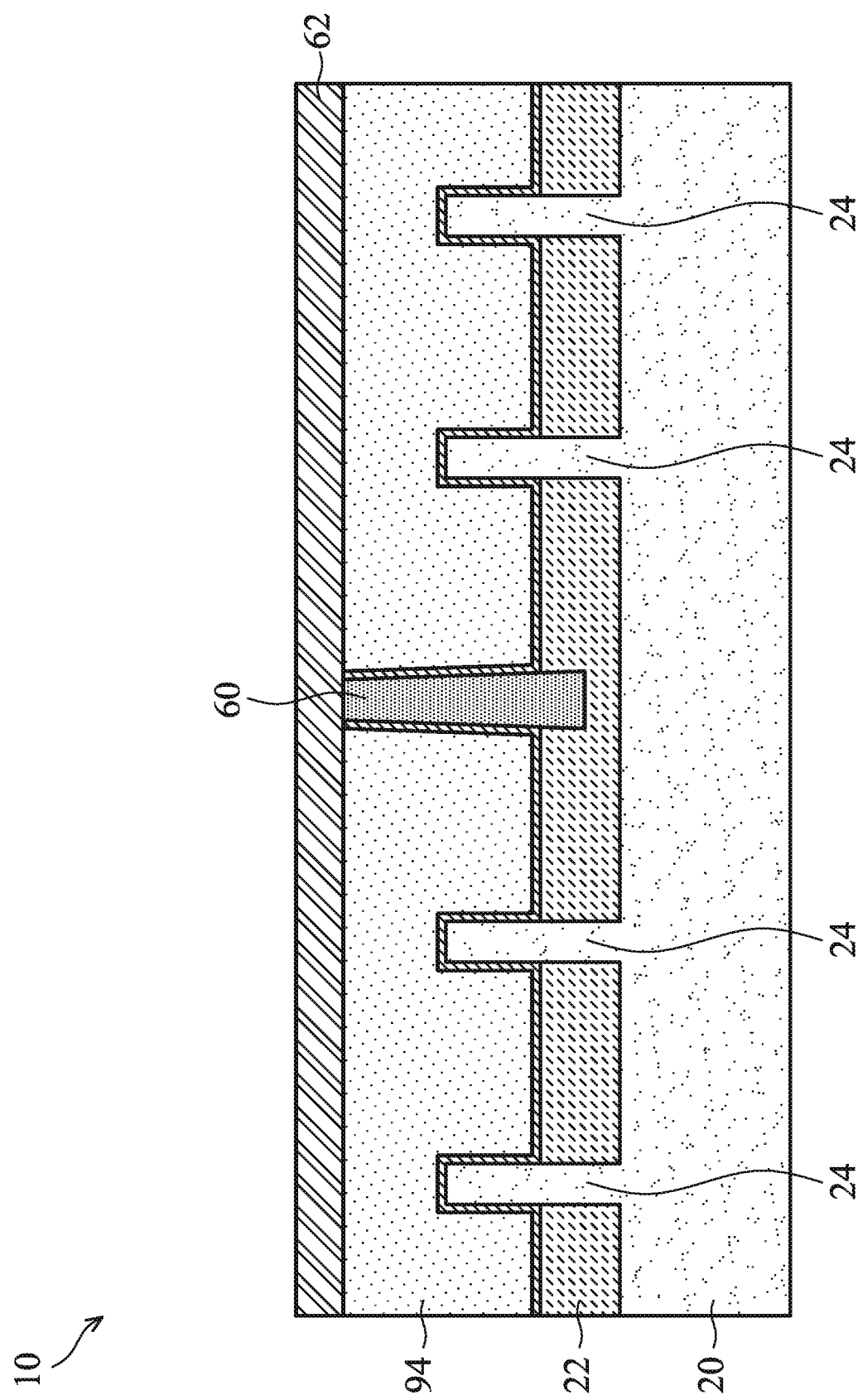
FIGS. 21 and 22 illustrate cross-sectional views of intermediate stages in the formation of gate isolation regions of a FinFET device, in accordance with other embodiments.
Figure 22:
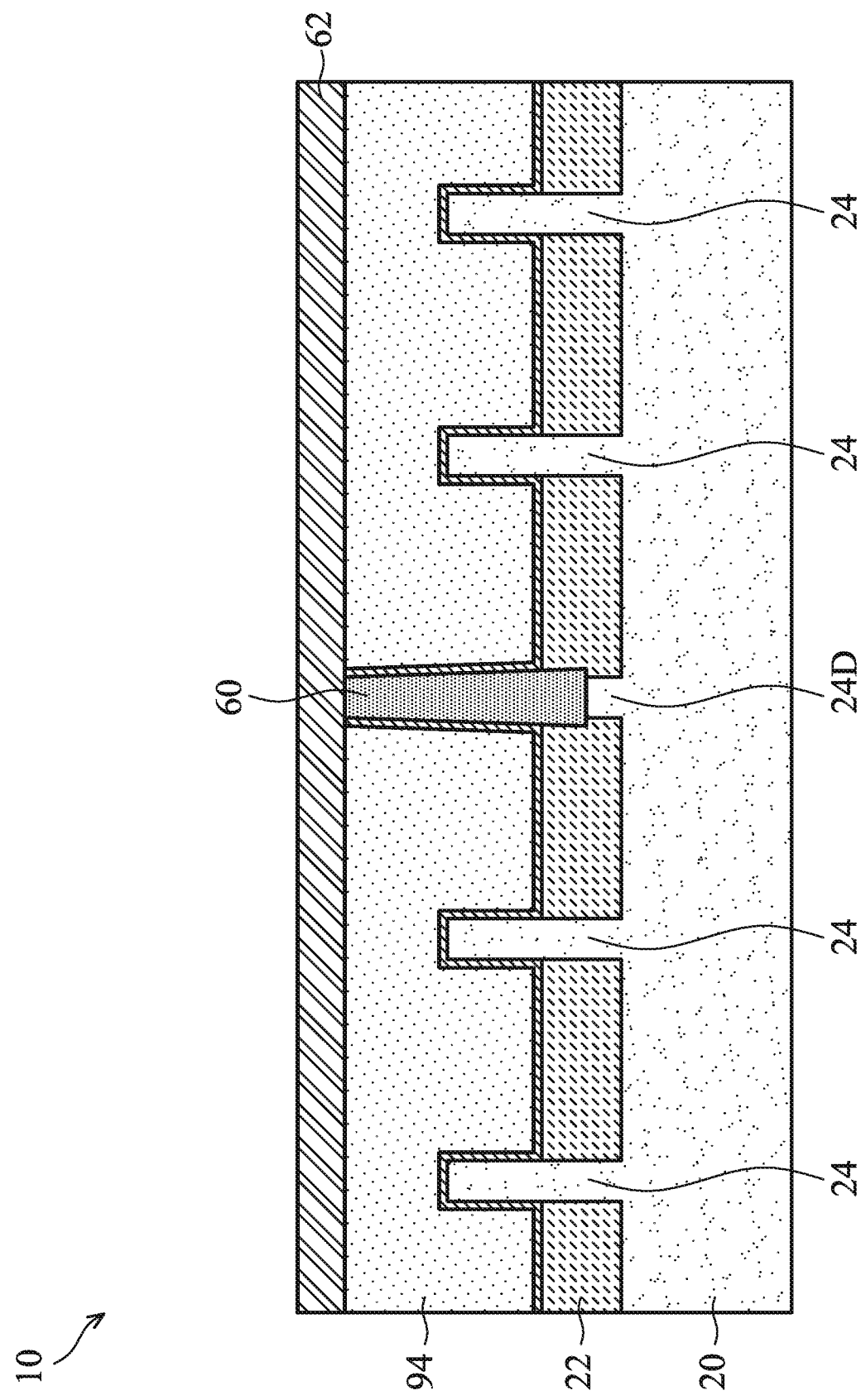

Turning to FIGS. 21 and 22, gate isolation regions 60 are illustrated in accordance with alternative embodiments. The gate isolation regions 60 shown in FIGS. 21 and 22 are shown in a cross-sectional view similar to FIG. 18B. FIG. 21 illustrates an embodiment in which the gate isolation region 60 extends into the STI regions 22, such as may be formed from the gate isolation opening 56 of the embodiment shown in FIG. 13. FIG. 21 also shows an embodiment in which no dielectric dummy gate 25 is present, similar to FIG. 13. In some embodiments, the gate isolation region 60 may extend fully through the STI regions 22 and into the substrate 20.

FIG. 22 illustrates an embodiment in which a dummy fin 24D is formed instead of a dielectric dummy fin 25. The dummy fin 24D may be formed in a manner similar to the other fins 24. As shown in FIG. 22, the gate isolation region 60 extends over the dummy fin 24D and extends into the STI regions 22. In some embodiments, the bottom of the gate isolation opening 56 may be formed extending below the top of the dummy fin 24D and then filled with the dielectric material 60' to form the gate isolation region 60. Upper portions of the dummy fin 24D may be removed during etching of the gate isolation opening 56. The gate isolation opening 56 may extend to the STI regions 22 or into the STI regions 22, or may extend through the STI regions 22 and into the substrate 20, in some embodiments.

Returning to FIGS. 19A, 19B, and 19C, a second ILD 108 is deposited over the first ILD 48. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

In FIGS. 20A, 20B, and 20C, gate contacts 110 and source/drain contacts 112 are formed through the second ILD 108 and the first ILD 48, in accordance with some embodiments. Openings for the source/drain contacts 112 are formed through the first and second ILDs 48 and 108, and openings for the gate contact 110 are formed through the second ILD 108 and the hard mask 62. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 42 and the source/drain contacts 112. The source/drain contacts 112 are physically and electrically coupled to the epitaxial source/drain regions 42, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Although not explicitly shown, a person having ordinary skill in the art will readily understand that further processing steps may be performed on the structure in FIGS. 20A, 20B, and 20C. For example, various Inter-Metal Dielectrics (IMD) and their corresponding metallizations may be formed over the second ILD 108.

Embodiments may achieve advantages. By controlling formation of the sacrificial material during etching of the gate isolation openings, the shape or profile of the gate isolation openings can be controlled. For example, a gate isolation opening can be formed having a smaller top width than bottom width. Filling these gate isolation openings with an insulating material can form gate isolation regions having a smaller top width than bottom width. By forming gate isolation regions having a narrower upper portion, material can be more completely removed from the gate isolation regions or underlying structures such as dummy fins during etching or cleaning steps. This can improve process reliability and device reliability, and reduce undesirable effects such as voltage threshold shift. Additionally, gate isolation regions formed as described herein can allow gate stack material to be deposited with greater fill efficiency. Thus, the techniques described herein can allow for improved device performance and improved processing reliability.

In some embodiments, a method includes forming a first fin and a second fin protruding from a semiconductor substrate; forming a dummy gate extending over the first fin and the second fin; forming a patterned mask over the dummy gate, the patterned mask including an opening between the first fin and the second fin; etching the dummy gate through the opening in the patterned mask to form a recess in the dummy gate, the etching including a plasma etching process, the plasma etching process using process gases including one or more etching gases and one or more polymer-forming gases, wherein during the etching the process gases react with the material of the dummy gate to form reaction products that deposit on sidewalls of the recess; depositing an insulation material to fill the recess, the insulation material covering the reaction products; removing the dummy gate and the reaction products; and forming a first gate structure extending over the first fin and a second gate structure extending over the second fin, wherein the insulation material extends from the first gate structure to the second gate structure. In an embodiment, the reaction products are formed having a first thickness on sidewalls near the top of the recess that is greater than a second thickness of the reaction products on sidewalls near the bottom of the recess. In an embodiment, the first thickness is in a range between 1 nm and 10 nm. In an embodiment, the reaction products are a polymer that includes silicon. In an embodiment, the reaction products include at least one of $SiO_x$, $SiN_x$, $SiBr_xO_y$, or $SiO_xCl_y$. In an embodiment, the polymer-forming gases include at least one of $O_2$, $CO_2$, $SO_2$, $N_2$, or HBr. In an embodiment, the insulation material includes silicon nitride. In an embodiment, the method includes forming a hard mask layer on the dummy gate, wherein the recess extends through the hard mask layer. In an embodiment, the dummy gate and the reaction products are removed in the same step.

In some embodiments, a method includes forming a first fin and a second fin on a substrate; forming a dummy gate material over the first fin and the second fin; etching the dummy gate material using a first etching process to form a recess between the first fin and the second fin, wherein a sacrificial material is formed on sidewalls of the recess during the first etching process; filling the recess with an insulation material; removing the dummy gate material and the sacrificial material using a second etching process; and forming a first replacement gate over the first fin and a second replacement gate over the second fin, wherein the first replacement gate is separated from the second replacement gate by the insulation material. In an embodiment, the first etching process includes a plasma etching process using an etching gas and a polymer-forming gas. In an embodiment, the sacrificial material is formed having a greater thickness on upper portions of the sidewalls of the recess than on lower portions of the sidewalls of the recess. In an embodiment, a top surface of the insulation material has a smaller width than a bottom surface of the insulation material. In an embodiment, the sacrificial material is silicon oxide. In an embodiment, the method includes forming a dummy fin between the first fin and the second fin, wherein the recess exposes the dummy fin, and wherein the insulation material remains on the dummy fin after the second etching process.

In some embodiments, a device includes first fins protruding from a substrate; second fins protruding from the substrate; a first gate stack extending over the first fins; a second gate stack extending over the second fins, wherein the first gate stack is longitudinally aligned with the second gate stack; and an isolation region extending between the first gate stack and the second gate stack, the isolation region electrically isolating the first gate stack from the second gate stack, wherein a first distance between the first gate stack and the second gate stack near a top surface of the isolation region is smaller than a second distance between the first gate stack and the second gate stack near a bottom surface of the isolation region. In an embodiment, the device includes a dielectric fin extending from the bottom surface of the isolation region toward the substrate, wherein a bottom surface of the dielectric fin is below a bottom surface of the first gate stack. In an embodiment, the isolation region extends into the substrate. In an embodiment, the first gate stack extends under the bottom surface of the isolation region. In an embodiment, the first distance is between 1 nm and 70 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin and a second fin protruding from a semiconductor substrate;
   forming a dummy gate extending over the first fin and the second fin;
   forming a patterned mask over the dummy gate, the patterned mask comprising an opening between the first fin and the second fin;
   etching the dummy gate through the opening in the patterned mask to form a recess in the dummy gate, the etching comprising a plasma etching process, the plasma etching process using process gases comprising one or more etching gases and one or more polymer-forming gases, wherein during the etching the process gases react with the material of the dummy gate to form reaction products that deposit on sidewalls of the recess;
   depositing an insulation material to fill the recess, the insulation material covering the reaction products;
   removing the dummy gate and the reaction products; and
   forming a first gate structure extending over the first fin and a second gate structure extending over the second fin, wherein the insulation material extends from the first gate structure to the second gate structure.

2. The method of claim 1, wherein the reaction products are formed having a first thickness on sidewalls near the top of the recess that is greater than a second thickness of the reaction products on sidewalls near the bottom of the recess.

3. The method of claim 2, wherein the first thickness is in a range between 1 nm and 10 nm.

4. The method of claim 1, wherein the reaction products are a polymer that comprises silicon.

5. The method of claim 4, wherein the reaction products comprise at least one of $SiO_x$, $SiN_x$, $SiBr_xO_y$, or $SiO_xCl_y$.

6. The method of claim 1, wherein the polymer-forming gases comprise at least one of $O_2$, $CO_2$, $SO_2$, $N_2$, or HBr.

7. The method of claim 1, wherein the insulation material comprises silicon nitride.

8. The method of claim 1, further comprising forming a hard mask layer on the dummy gate, wherein the recess extends through the hard mask layer.

9. The method of claim 1, wherein the dummy gate and the reaction products are removed in the same step.

10. A method comprising:
    forming a first fin and a second fin on a substrate;
    forming a dummy gate material over the first fin and the second fin;
    etching the dummy gate material using a first etching process to form a recess between the first fin and the second fin, wherein a sacrificial material is formed on sidewalls of the recess during the first etching process;
    filling the recess with an insulation material;
    removing the dummy gate material and the sacrificial material using a second etching process; and
    forming a first replacement gate over the first fin and a second replacement gate over the second fin, wherein the first replacement gate is separated from the second replacement gate by the insulation material.

11. The method of claim 10, wherein the first etching process comprises a plasma etching process using an etching gas and a polymer-forming gas.

12. The method of claim 10, wherein the sacrificial material is formed having a greater thickness on upper portions of the sidewalls of the recess than on lower portions of the sidewalls of the recess.

13. The method of claim 10, wherein a top surface of the insulation material has a smaller width than a bottom surface of the insulation material.

14. The method of claim 10, wherein the sacrificial material is silicon oxide.

15. The method of claim 10, further comprising forming a dummy fin between the first fin and the second fin, wherein the recess exposes the dummy fin, and wherein the insulation material remains on the dummy fin after the second etching process.

16. A method comprising:
    forming a plurality of first fins protruding from a substrate;
    forming a plurality of second fins protruding from the substrate;
    forming a gate structure extending over the plurality of first fins and over the plurality of second fins;
    etching a recess in the gate structure;
    depositing a sacrificial material on sidewalls of the recess;
    forming an isolation region within the recess, wherein a top surface of the isolation region is level with a top surface of the gate structure, wherein the isolation region separates the gate structure into a first gate stack extending over the plurality of first fins and a second gate stack extending over the plurality of second fins, wherein the isolation region electrically isolates the first gate stack from the second gate stack, wherein a first separation distance between the first gate stack and the second gate stack near the top surface of the isolation region is smaller than a second separation distance between the first gate stack and the second gate stack near a bottom-most surface of the isolation region, wherein a bottom surface of the isolation region is free of the sacrificial material; and
    fully removing the sacrificial material.

17. The method of claim 16, wherein the first gate stack extends under the bottom-most surface of the isolation region.

18. The method of claim 16, wherein a third separation distance between the first gate stack and the second gate stack below the bottom-most surface of the isolation region is smaller than the second separation distance.

19. The method of claim 16 further comprising, before removing the sacrificial material, performing a planarization process on upper portions of the sacrificial material.

20. The method of claim 16, wherein the first gate stack and the second gate stack are free of the sacrificial material.

* * * * *